(12) United States Patent
Tamita et al.

(10) Patent No.: US 7,312,584 B2
(45) Date of Patent: Dec. 25, 2007

(54) PLASMA-GENERATION POWER-SUPPLY DEVICE

(75) Inventors: Taichiro Tamita, Tokyo (JP); Akihiko Iwata, Tokyo (JP); Noboru Wada, Tokyo (JP); Shingo Mine, Tokyo (JP); Hajime Nakatani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 10/599,059

(22) PCT Filed: Oct. 18, 2004

(86) PCT No.: PCT/JP2004/015362

§ 371 (c)(1),
(2), (4) Date: Sep. 19, 2006

(87) PCT Pub. No.: WO2005/094138

PCT Pub. Date: Oct. 6, 2005

(65) Prior Publication Data

US 2007/0205727 A1   Sep. 6, 2007

(30) Foreign Application Priority Data

Mar. 29, 2004 (JP) ............................. 2004-095248

(51) Int. Cl.
*H05B 41/16* (2006.01)
*H05B 37/02* (2006.01)

(52) U.S. Cl. ............... 315/247; 315/224; 315/226; 315/276; 315/284; 315/306

(58) Field of Classification Search .......... 315/111.01, 315/111.21, 200 R, 209 R, 224, 225, 226, 315/246, 247, 276, 283, 284, 291, 307, 308, 315/326; 323/305, 355; 345/211, 212
See application file for complete search history.

(56) References Cited

U.S. PATENT DOCUMENTS

| | | | | |
|---|---|---|---|---|
| 5,932,116 A | * | 8/1999 | Matsumoto et al. | ... 219/121.57 |
| 5,936,358 A | * | 8/1999 | Okamoto et al. | ........... 315/248 |
| 6,082,294 A | | 7/2000 | Simpson | ................ 422/186.15 |
| 6,143,256 A | | 11/2000 | Shinagawa et al. | ...... 118/723 E |
| 6,445,137 B1 | * | 9/2002 | Okamoto et al. | ........... 315/246 |

FOREIGN PATENT DOCUMENTS

| | | |
|---|---|---|
| JP | 6-305705 | 11/1994 |
| JP | 7-177749 | 7/1995 |
| JP | 10-101479 | 4/1998 |
| JP | 11-29306 | 2/1999 |
| JP | 11-224795 | 8/1999 |
| JP | 11-288796 | 10/1999 |
| JP | 2001-35693 | 2/2001 |
| JP | 2003-151796 | 5/2003 |
| JP | 2003-180082 | 6/2003 |
| JP | 2003-203800 | 7/2003 |
| JP | 2003-321210 | 11/2003 |

* cited by examiner

*Primary Examiner*—Thuy Vinh Tran
(74) *Attorney, Agent, or Firm*—Leydig, Voit & Mayer, Ltd.

(57) ABSTRACT

A plasma-generation power-supply device includes a transformer connected to an alternating-current power-supply, a rectifier connected to the transformer, an inverter connected to the rectifier, a reactor inserted in series in a power line of an ozonizer that is supplied with power from the inverter, and a controller that controls the inverter. The controller detects the current flowing to the ozonizer with a current detector and provides a control that keeps power applied to the ozonizer constant.

8 Claims, 19 Drawing Sheets

F I G . 2 5
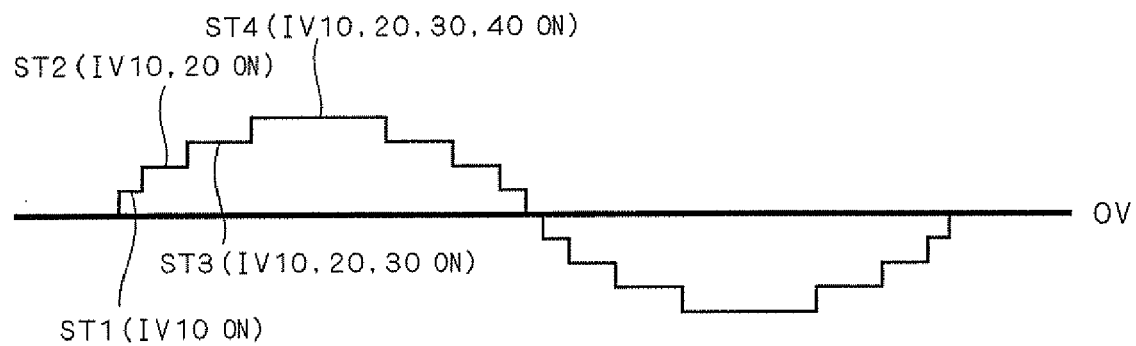
F I G . 2 6
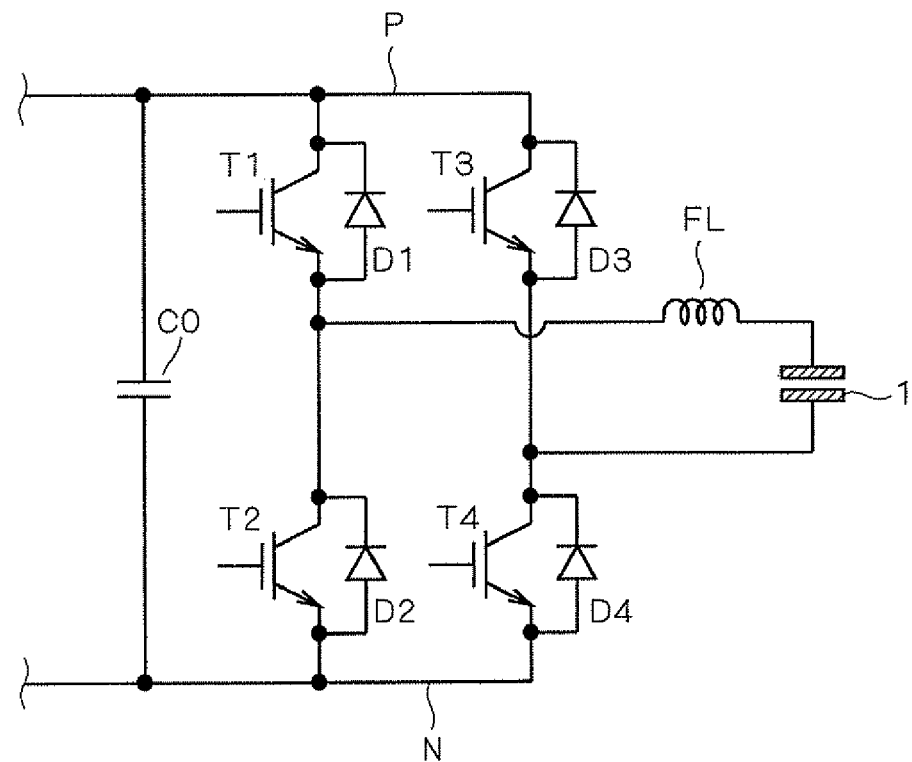

PLASMA-GENERATION POWER-SUPPLY DEVICE

This Application is a National Phase Application under 35 U.S.C. 371 claiming the benefit of PCT/JP04/15362 filed on Oct. 18, 2004, which has priority based on Japan Application No. 2004-095248 filed on Mar. 29, 2004.

TECHNICAL FIELD

The present invention relates to a power-supply device for use in generation of plasma, and particularly to a power-supply device for use in plasma generation with an ozonizer, flat-plate light source, laser oscillator, and the like.

BACKGROUND ART

In a discharge system called dielectric barrier discharge or silent discharge, an alternating voltage is applied to oppositely placed electrodes with the high-potential electrode covered with a dielectric, so as to cause a discharge. This type of discharge is used in a wide variety of industrial applications that utilize chemical reactions with plasmas, because the discharge does not change to an arc and the electron temperature is stably kept high.

A particularly typical application thereof is that to ozonizers or ozone generating apparatuses, and so the dielectric barrier discharge is sometimes called ozonizer discharge. Other apparatuses that utilize this type of discharge include flat-plate light sources, carbon dioxide gas lasers, plasma displays, and the like. In particular, the electric operating region of flat-plate light sources is the closest to that of ozonizers.

Such ozone generating apparatuses and laser oscillators require power-supply devices for plasma generation. An example of such a plasma-generation power-supply device is disclosed in FIG. 12 of Patent Document 1. The structure of this example includes a discharging load in which a dielectric is interposed between a pair of oppositely placed electrodes to form a gas region serving as a discharging space, and the gas in this discharging space is excited to generate a plasma. The structure also includes a parallel inductor connected in parallel with the discharging load to improve the power factor. Electric power is supplied from an alternating-current power-supply to the discharging load through a rectifier, an inverter, and a transformer Its operation will be described next. A commercial alternating voltage from the input power-supply is converted to a direct voltage by the rectifier, and further converted to an alternating voltage of a given frequency by the inverter. It is then boosted by the transformer to a voltage that starts discharge, and the high voltage is thus applied to the discharging load. The applied high voltage causes a discharge in the discharging load and the discharge excites gas particles.

Now, seen from an electric standpoint, the discharging load in which a dielectric is interposed between the discharging electrodes, i.e., the load using the dielectric barrier discharge, serves as a capacitor, and it is known that the current is advanced in phase with respect to the voltage. Accordingly, the power factor, expressed as a ratio between apparent power and active power, is low, and applying energy to the discharging load requires application of more current than necessary.

Therefore, the elements forming the transformer and the inverter need specifications capable of withstanding such current value, which leads to large-sizing and increased costs of the power-supply device.

The parallel inductor is connected as a phase delay component in parallel with the discharging load, in order to compensate for the lead of the current phase with respect to the voltage in the discharging load, and the lead of the current phase in the discharging load and the delay of the current phase by the parallel inductor are set equal to each other so that the phases of current and voltage supplied from the power-supply device match each other, which allows efficient application of power to the discharging load with minimum current. When individual components are ideal ones, then the power factor is 100% and a condition called resonance occurs.

In this way, in the conventional plasma-generation power-supply, the parallel inductor is connected in parallel with the discharging load to improve the power factor, so that the power-supply device can be smaller-sized and lower-priced with smaller-capacity power-supply elements.

Patent Document 1: Japanese Patent Application Laid-Open No. 2001-35693 (FIG. 12).

The load of such an apparatus using dielectric barrier discharge is characterized in that the electrostatic capacity of the load dynamically varies depending on whether the load is discharging or not. This is closely related to the design of the circuit for driving it, and Patent Document 1 mentioned above achieves the circuit design by representing the electrostatic capacity of the load with a value between an electrostatic capacity in no discharging and an electrostatic capacity in discharging, or with a representative electrostatic capacity in operation.

However, the representative electrostatic capacity in the operating state varies depending on the waveform condition, and the power applied to the ozonizer chiefly depends on the peak value of the voltage waveform. The representative electrostatic capacity in the operating state therefore depends also on the power applied to the ozonizer. This means that the resonance condition between the discharging load and the circuitry varies when the applied power is varied.

Patent Document 1 describes a method in which the resonance condition is set within a certain range, specifically between the electrostatic capacity in the non-discharging state and the electrostatic capacity in the discharging state, mentioning reasons that the resonance varies with a variation of the load, that the operation becomes sensitive at the resonance point, etc. This is certainly an effective method, but is disadvantageous when the capacity of the power-supply is to be minimized by making the power factor as high as possible when maximum power is applied and the power dissipation of the power-supply becomes maximum.

Also, the load may vary or the circuit constant may somewhat deviate. There is no guarantee that the load can be driven most suitably in such cases.

Also, even if the electrostatic capacity of the discharging load is strictly constant, the resonance condition depends on the applied power and therefore adjusting the applied power inevitably varies the resonance condition, and the driving condition deviates from the most suitable state.

Furthermore, when the maximum rated power is being applied and the load is driven with a high power factor in the vicinity of the resonance point, decreasing the applied power makes the control of the power-supply or discharge unstable. No measures have conventionally been taken against this phenomenon, and it is not even clear for what physical reasons this phenomenon occurs.

DISCLOSURE OF THE INVENTION

The present invention has been made to solve the above problems, and an object of the invention is to provide a plasma-generation power-supply device that is capable of driving with a power factor as high as possible under a maximum rated condition and of keeping stable operation even when the applied power is varied.

According to a first aspect of the invention, a plasma-generation power-supply device that drives a discharging load that generates a plasma comprises an alternating-current power-supply that supplies power to said discharging load, and a controller that is capable of controlling the frequency of an alternating output of said alternating-current power-supply, and said controller provides control to vary the power-supply frequency of said alternating-current power-supply in accordance with a target applied power to said discharging load.

According to the plasma-generation power-supply device, the controller provides control to vary the power-supply frequency of the alternating-current power-supply in accordance with the target applied power to the discharging load. Accordingly, when the maximum rated power is applied, the frequency of the alternating-current power-supply is set close to the resonant frequency of the load to achieve driving operation with a high power factor, so that the capacity of the alternating-current power-supply can be reduced, and the frequency is set higher when the applied power is smaller, so as to achieve stable control of the discharge.

According to a second aspect of the present invention, a plasma-generation power-supply device that drives a discharging load that generates a plasma comprises an alternating-current power-supply that supplies power to said discharging load, a variable passive element that varies the circuit constant of a circuit provided on the output side of said alternating-current power-supply and including said discharging load, and a controller that variably controls said variable passive element, and said controller variably controls said variable passive element in accordance with a target applied power to said discharging load.

According to the plasma-generation power-supply device, the controller variably controls the variable passive element that varies the circuit constant, according to the target applied power to the discharging load, whereby the target power can be applied to the discharging load.

According to a third aspect of the present invention, a plasma-generation power-supply device that drives a discharging load that generates a plasma comprises an alternating-current power-supply that supplies power to said discharging load, and resonance means that causes the alternating voltage outputted from said alternating-current power-supply to jump by resonance and applies the jump voltage as a load voltage to said discharging load, and said alternating-current power-supply is connected electrically directly to said resonance means.

According to the plasma-generation power-supply device, the alternating-current power-supply is connected electrically directly to the resonance means, and the output voltage of the alternating-current power-supply is made to jump by resonance and given to the discharging load, which eliminates a need for, e.g., an expensive high-frequency transformer, and allows cost reduction.

These and other objects, features, aspects and advantages of the present invention will become more apparent from the following detailed description of the present invention when taken in conjunction with the accompanying drawings.

BRIEF DESCRIPTION OF THE DRAWINGS

[FIG. 25] A diagram showing an example of an output waveform of the inverter having four stages of inverter blocks.

[FIG. 26] A diagram illustrating the configuration of an inverter.

BEST MODE FOR CARRYING OUT THE INVENTION

<1. Introduction>
<1-1. Basic Operation>

First, a plasma-generation power-supply device 90 having a simplified configuration will be described referring to FIGS. 1 to 3, in order to describe the basic operation of the power-supply device according to a first preferred embodiment of the present invention.

Figure 1:
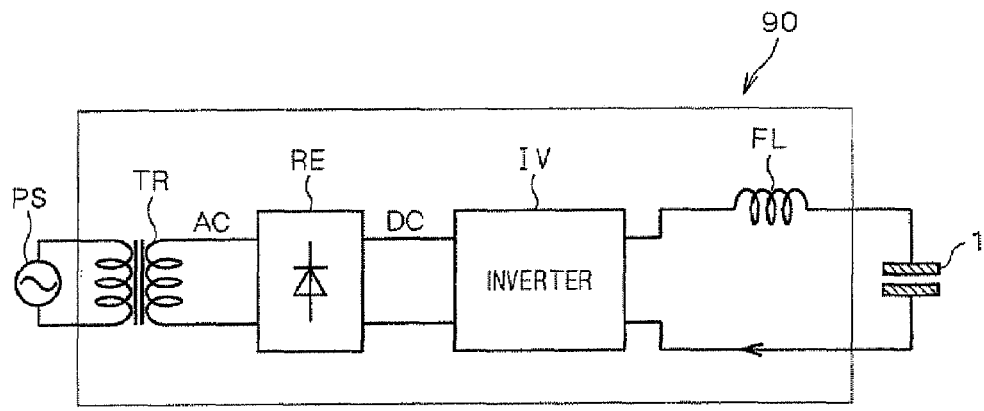
[FIG. 1] A diagram illustrating the basic configuration of a plasma-generation power-supply device according to a preferred embodiment of the present invention.

As shown in FIG. 1, the plasma-generation power-supply device 90 includes a transformer TR connected to an alternating-current power-supply PS as a power source, a rectifier RE connected to the transformer TR, an inverter IV (alternating-current power-supply) connected to the rectifier RE, and a reactor FL (resonance means) inserted in series in the power line of an ozonizer 1 that is supplied with power from the inverter IV. The inverter IV is connected electrically directly to the reactor FL. Connecting the inverter IV electrically directly to the reactor FL means that the output of the inverter IV is connected to the reactor FL not through magnetic transmission means such as a transformer, but through electric transmission means such as an interconnection line.

In the ozonizer 1, a pair of electrodes are placed oppositely, with a dielectric interposed between them, to form a gas region as a discharge space, and the gas in the discharge space is excited to generate an ozone plasma.

In the plasma-generation power-supply device 90, the alternating-current power supplied from the alternating-current power-supply PS is adjusted to a desired voltage in the transformer TR, and rectified in the rectifier RE to provide a direct voltage supply.

The direct voltage supplied from the rectifier RE is converted in the inverter IV to an alternating voltage of a certain frequency and given directly to the reactor FL, and the voltage at the two electrodes of the ozonizer 1 is made much higher than the inverter output because of the resonance of the reactor FL and the electrostatic capacity of the ozonizer 1.

With this structure, the voltage input to the inverter IV is made sufficiently high, and a high voltage, to be applied to the ozonizer 1, is obtained at the two electrodes of the ozonizer 1. Providing the transformer TR preceding the rectifier RE allows a cost reduction of the entire power-supply device.

Figure 2:
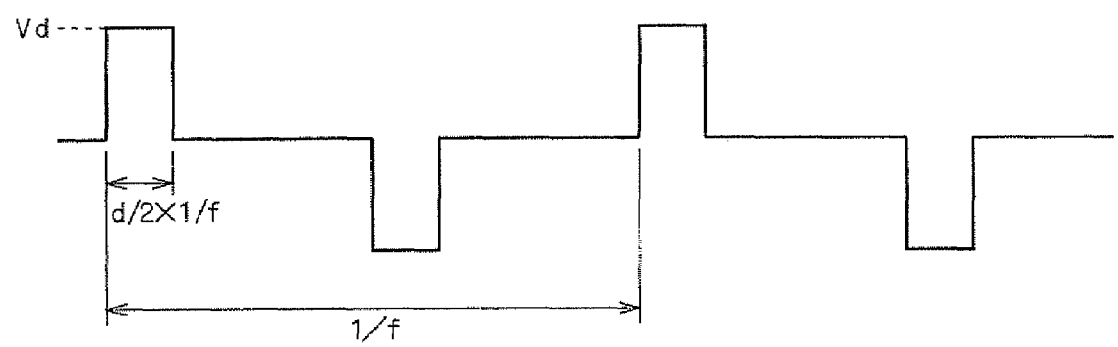
[FIG. 2] A diagram showing a voltage waveform of an inverter.

Now, FIG. 2 shows a voltage waveform at the output of a full-bridge inverter. FIG. 2 shows the inverter's bus voltage as Vd.

When the power dissipation of the inverter is sufficiently small, the output exhibits a rectangular waveform and its power-supply frequency f and duty, i.e., power-supply control ratio d, characterize the operation of the inverter.

When the frequency is f, the duration of one cycle is given as 1/f. Since the dielectric barrier discharge is alternating-current-driven, the positive pulse width and the negative pulse width are controlled to be equal as long as there is no special reason, in which case one pulse width is d/f/2.

During operation of an inverter, the applied power is generally controlled by varying the duty, with the frequency kept constant. This is called pulse width control or PWM (Pulse Width Modulation). For example, when the applied current to the load is controlled to be constant, a feedback control is applied by increasing/decreasing the duty by PWM so that the applied current value remains constant.

<1-2. Stability of Discharge>

Next, the stability of discharge will be described. In general, in a plasma-generation power-supply device, the current or power is controlled to be constant by feedback-controlling, e.g., the current given to the discharging load. This scheme is effective while the power consumption of the discharging load remains relatively stable. However, when the discharging load is unstable and its power varies with a very short time constant, then the feedback control (which generally has sufficiently slower response than the time constant of the variation of the discharge) is unable to keep the applied power constant but allows the applied power to vary. This phenomenon is especially noticeable when the power is small. A reason thereof will be described below.

Suppose that, at a certain frequency f1, the duty is set close to the maximum value, e.g., at 0.8, the circuit elements are set close to the resonance condition, and certain discharge power is being obtained. In this case, suppose that the average electrostatic capacity of the discharging load under this discharge power condition is $C\gamma$, the resonant frequency of the reactor (inductance L) of the circuit is f0, and the frequency f1 is sufficiently close to the resonant frequency f0, more accurately somewhat higher than the value f0 of the power-supply frequency f given by Expression (1) below.

[Expression 1]

$$L = \frac{1}{C\gamma(2\pi f)^2} \quad (1)$$

The average electrostatic capacity $C\gamma$ of the discharging load is given by Expression (2) below.

[Expression 2]

$$C\gamma = Cg\left(1 - \frac{V^*}{VO_p}\right) + Cp \quad (2)$$

In Expression (2) above, $VO_p$ is a peak value of the voltage applied to the load, $V^*$ is a discharge maintaining voltage, and Cg is an electrostatic capacity of the dielectric of the discharging load.

Figure 3:
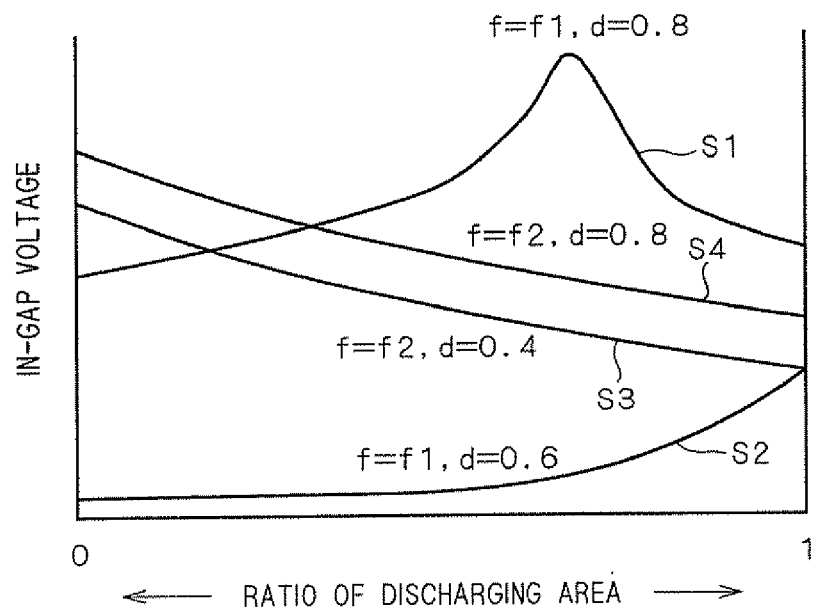
[FIG. 3] A diagram showing variations of voltage applied to an ozonizer.

FIG. 3 shows variations of the voltage applied to the ozonizer 1 that are exhibited when the discharging area varies (the discharge turns off) under this condition. In FIG. 3, the horizontal axis shows the ratio of discharging area and the vertical axis shows the voltage at the two electrode ends of the ozonizer 1, i.e., the in-gap voltage, where the ratio of discharging area being 1 indicates that the entire region is on, and the ratio 0 indicates that the entire region is off.

As shown in FIG. 3, under the condition mentioned above, i.e., with the curve S1 of f=f1 and d=0.8, the voltage rises as the discharging area ratio becomes smaller from 1 (from the state where the entire area is on), and the voltage achieves its peak at a certain value of the discharging area ratio. After that, the voltage decreases as the discharging area ratio decreases.

At the frequency f0, Expression (1) holds, and the peak of resonance is at the right end of the graph, but, because the frequency f1 is set somewhat higher than f0 as mentioned above, the peak of the curve of d=0.8 appears between the discharging area ratios 1 and 0.

Now, suppose that the ozonizer 1 is in a normal condition in which the discharge is on in the entire region and then part of it turns off for some reason. This means that the ratio of discharging area varies somewhat to the left from the right end of FIG. 3. In this case, the curve of f=f1 and d=0.8 shows that the voltage becomes higher.

This means that the voltage applied to the ozonizer 1 increases even when the discharge partially turns off and as a result the voltage applied between the electrodes in the non-discharging region increases to turn on the off-region again. That is, even when the discharge partially turns off, the circuit operates to turn it on again, i.e., a negative feedback works and the discharge condition is kept stable and the discharge is controlled stably.

Next, suppose that the duty is made smaller with the frequency kept at f1 to lower the discharge power. For example, with f=f1 and d=0.6, the voltage at the two electrode ends of the ozonizer 1 varies with respect to the discharging area as shown by the curve S2 of f=f1 and d=0.6 in FIG. 3.

This curve S2 has no peak value. This is because the electrostatic capacity Cγ of the discharging load becomes smaller as the applied power varies, and as a result the resonant frequency becomes higher than the frequency f1 and the resonance peak does not appear between the discharging area ratios 1 and 0.

As for the tendency of the curve S2, it seems that a resonance peak may appear when the discharging area ratio becomes larger than 1, but the discharging area ratio never comes to the right of 1 (the discharging ratio never exceeds 1), and it can be said that the electrostatic capacity Cγ of the discharging load is larger than when the discharging area ratio is 1.

Now, also with the curve S2, suppose that the ozonizer 1 is in a normal condition in which the discharge is on in the entire region and then part of it turns off for some reason. That is, when the ratio of discharging area has varied somewhat to the left from the right end of FIG. 3, then the voltage applied to the ozonizer 1 becomes lower as shown by the curve S2.

This is because the curve S2 is formed of the characteristic on the left of the resonance peak of the curve S1, meaning that the circuit operates in a direction opposite to the variation of the load, and if the discharge partially turns off for some reason, then a positive feedback works and the voltage applied to the ozonizer 1 becomes lower and as a result the off-area further increases.

In this case, when no control is applied on the power-supply side, the discharge turns off in a chain-reaction manner and the entire region will finally turn off. In practice, as mentioned earlier, the discharge is prevented from completely turning off because it is dynamically controlled by a feedback based on the detected current, but the discharge cannot be stably controlled because of the above-mentioned reason related to the time constant of the control.

Thus, it is concluded from what described above that the discharge is unstable when the curve in FIG. 3 has a positive slope near the right end, and the discharge can be stably controlled when the slope is negative.

Now, a curve having a negative slope near the right end of FIG. 3 can be obtained by varying the frequency.

For example, suppose that a frequency f2, still higher than the frequency f1, is selected. It is assumed that this frequency f2 is still higher than the resonant frequency that corresponds to the electrostatic capacity Cγ of the discharging load that is exhibited with the applied power obtained when f=f1 and d=0.6.

When the duty is varied at this frequency, the power equivalent to that with f=f1 and d=0.6 can be applied at the duty d=0.4.

In this case, as the discharging area varies, the voltage of the two electrode ends of the ozonizer 1 varies as shown by the curve S3 of f=f2 and d=0.4 in FIG. 3.

The curve S3 simply decreases from the discharging area ratio 0 to 1, and it seems that a resonance peak may appear when the discharging area ratio becomes smaller than 0. However, because the discharging area ratio cannot be on the left of 0 (the discharge ratio can never be smaller than 0), and it can be said that the electrostatic capacity Cγ of the discharging load is smaller than when the discharging area ratio is 0.

Thus, it is seen that the curve has the shape on the right of the left of the resonance peak throughout the entire discharging area ratio from 0 to 1, and it has a negative slope and allows stable control.

Then, f2 is selected as the power-supply frequency and the duty is increased from the condition f=f2 and d=0.4. It is thought that a stable driving condition will be obtained even when the duty is varied, because increasing the duty increases the electrostatic capacity Cγ of the discharging load and lowers the resonant frequency, and also because the frequency f2 is sufficiently high.

In this case, as the discharging area varies, the voltage at the two electrode ends of the ozonizer 1 varies as shown by the curve S4 of f=f2 and d=0.8 in FIG. 3.

The curve S4, like the curve S3, simply decreases from the discharging area ratio 0 to 1 and has a negative slope near the right end, which means that the condition allows stable control. However, the voltage value at the right end is much lower than that under the maximum rated condition mentioned first, i.e., much lower than the value with f=f1 and d=0.8. This means that the applied power is low, i.e., sufficient power cannot be applied at this frequency even when the duty is maximized.

It will be possible to apply the target power at the frequency f2 if the bus voltage of the inverter is increased. However, this means increasing the breakdown voltage and power-supply capacity of the inverter, leading to increased costs of the inverter.

Thus, it is concluded that, when the power-supply frequency is f1, the inverter's power-supply capacity can be reduced because the device is driven with a high power factor when the maximum power is applied, but the discharge becomes unstable when the power is lowered. On the other hand, with the power-supply frequency f2, the control remains stable in the entire region even when the power is varied, but the power factor at the maximum power is low and so the inverter's power-supply capacity must be large and the costs are increased.

<2. Configuration of the Device>

On the basis of the conclusion above, the inventors have developed a power-supply device that works stably in the entire power range while allowing smaller inverter capacity. The configuration of a plasma-generation power-supply device 100 of a first preferred embodiment of the invention will be described referring to FIG. 4.

Figure 4:
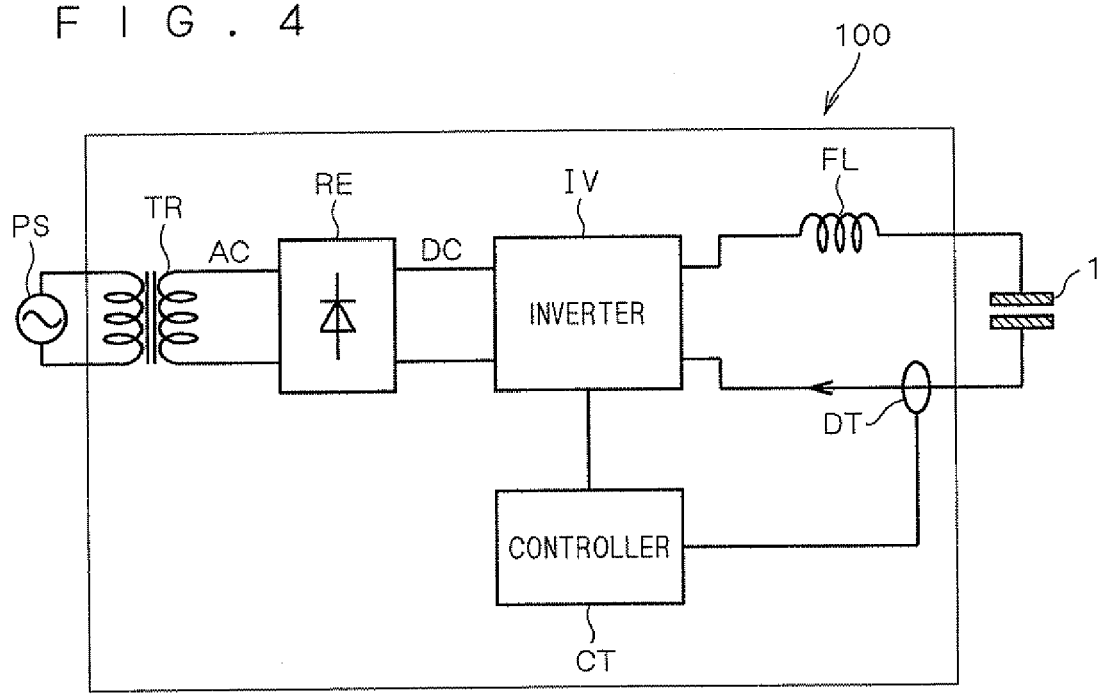
[FIG. 4] A diagram illustrating the configuration of a plasma-generation power-supply device according to the preferred embodiment of the invention.

As shown in FIG. 4, the plasma-generation power-supply device 100 includes a controller CT for controlling the inverter IV, and the controller CT has a current detector DT that detects the current flowing to the ozonizer 1 to provide control to keep the power applied to the ozonizer 1 constant. The same components as those of the plasma-generation power-supply device 90 of FIG. 1 are shown at the same reference characters and are not described here again.

This control scheme is effective because the power of an ozonizer is generally proportional to the current, but, when a load other than an ozonizer is used or when more precise control is desired, the structure may be configured to measure the voltage at the two ends of the load in addition to the flowing current.

<3. Operation of the Device>

<3-1. Outline of Control Operation>

Next, the outline of the control operation by the controller CT will be described.

On the basis of the current flowing to the ozonizer 1 detected by the current detector DT, the controller CT controls the inverter TV to achieve frequency and duty most suitable for the resonance condition of the load.

For example, the controller CT varies the frequency (f) of the inverter IV to obtain a value most suitable for the target power applied to the load (target applied power), and the controller CT measures the current to the load and provides a feedback control by increasing/decreasing the duty according to the measurement, so as to achieve the application of accurate target applied power.

Alternatively, the duty is fixed or limited in a certain range for the target applied power, and the frequency is adjusted finely.

With this control scheme that varies the frequency according to the applied power to the load, when the maximum rated power is applied, the inverter's frequency is set close to the resonant frequency of the load to achieve a driving operation with a high power factor, so that the inverter's capacity can be reduced, and the frequency is set higher when the applied power is lowered, so as to achieve a stable driving operation. When the applied power is small, the frequency is varied such that the power factor is lowered, but there is no need for increased capacity of the inverter because the applied power is small.

<3-2. Specific Example of Control Operation>

Now, a specific example of the control operation by the controller CT will be described referring to FIG. 5.

Figure 5:
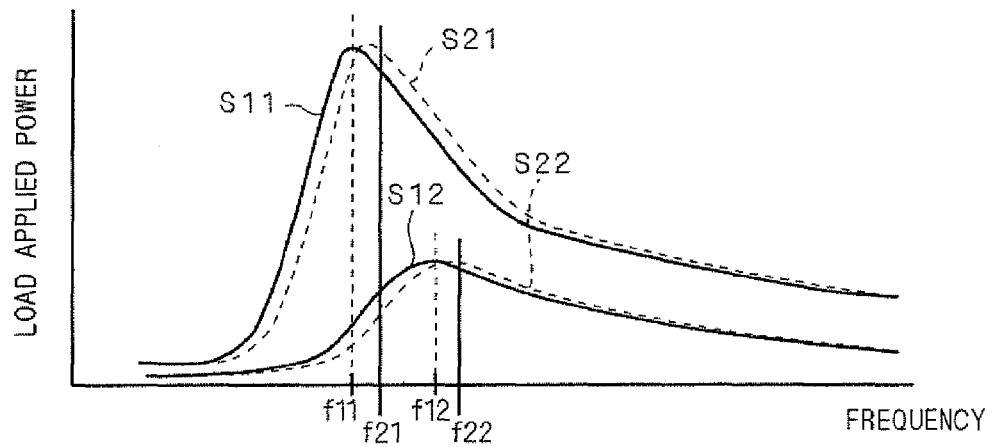
[FIG. 5] A diagram illustrating the control operation by a controller.

In FIG. 5, the horizontal axis shows the power-supply frequency (f) of the inverter IV and the vertical axis shows power applied to the load, and FIG. 5 shows how the applied power to the load varies when the frequency is varied, when the duty is maximum and when it is around 50%.

As the power-supply frequency comes closer to the resonance point, the voltage jumps and the applied power attains its maximum near the resonance point, and then the applied power becomes smaller as the frequency varies away from the resonance point. FIG. 5 clearly shows this tendency, and it is seen that the degree of the voltage jump varies as the power-supply frequency varies. The same tendency is exhibited also when the vertical axis shows the voltage peak value at the both ends of the load.

The frequency corresponding to the peak applied power value in FIG. 5 is the circuit's resonant frequency of that time. This is because, with the ozonizer 1, the applied power to the load depends on the voltage peak value at the two ends of the load.

In FIG. 5, S11 shows a frequency characteristic curve with a maximum duty, S12 shows a frequency characteristic curve with a duty of about 50%, f11 shows the frequency of resonance with the maximum duty, and f12 shows the frequency of resonance with the duty of about 50%.

As mentioned earlier, when the applied power to the ozonizer 1 is made smaller, the electrostatic capacity Cγ becomes smaller and the resonant frequency becomes higher as a result. Accordingly, it is seen by comparing the characteristic curves S11 and S12 of FIG. 5 that the resonant frequency of the curve S12 with smaller power is higher than that of the curve S11.

In FIG. 5, the curve S21 shows a characteristic curve obtained when the duty becomes slightly smaller than that of the maximum duty curve S11, and the curve S22 shows a characteristic curve obtained when the duty becomes slightly smaller than that of the 50% duty curve S12.

The curves S21 and S22 are slightly shifted to the right, i.e., to higher frequencies, respectively from the curves S11 and S12, and f21 and f22 show their resonant frequencies, respectively.

Now, a slight decrease in duty corresponds to a partial turn-off of the discharge. When the discharge thus partially turns off, the voltage applied to the load increases if the characteristic curve has a negative slope near the right end as shown by the curves S1, S3, and S4 of FIG. 3.

Accordingly, at the resonant frequency f21, the voltage applied to the load is higher than at the resonant frequency f11, meaning that the discharge power becomes higher.

When the discharge partially turns off while the inverter IV is operated at a frequency somewhat higher than the resonant frequency, then the voltage applied to the load becomes higher and the discharge turns on again and can be controlled stably.

On the other hand, when the discharge partially turns off while the inverter IV is operated at a frequency somewhat lower than the resonant frequency f11, then the voltage applied to the load becomes lower and the discharge becomes unstable and turns off in a chain-reaction manner.

Accordingly, it is desirable for stable driving operation to operate the inverter IV at a frequency higher than the resonant frequency of the load.

In other words, it means it is desired that the current is delayed in phase with respect to the voltage at the output end of the power-supply. That is, it is desired that the entirety of the load including the reactor is an L-load (inductive load) seen from the power-supply.

Thus, it is desirable for stable control of the discharge that the load seen from the power-supply output end is an L-load, i.e., the current at the power-supply output end is delayed in phase with respect to the voltage.

Causing the current to delay in phase at the power-supply output end is desirable independently of the value of the duty, and it is seen from FIG. 5 that the discharge can be stably controlled even with the duty of about 50% as long as the operation is performed at the frequency f22 that is higher than the resonant frequency f12.

Now, desirably, the resonant frequencies f11 and f21 have values as close as possible in a range where stable control is possible. This is because frequencies in the vicinity of the resonant frequency f11, more specifically, frequencies that are higher by 5% to 10% than the resonant frequency, correspond to a region that allows operations with highest power factors, i.e., a region where the power can be most efficiently applied to the load and the dissipation of the power-supply can be minimized.

Thus, raising the frequency too higher than the resonant frequency f11 enhances the stability of the discharge but lowers the power factor of the power-supply, which results in a need for a larger-capacity power-supply and hence increased costs of the power-supply. The capacity of the power-supply is determined by the power consumed when the maximum rated power is applied, and it is therefore desirable to drive the load with a highest possible power factor at least when the maximum rated power is applied.

Except when the maximum rated power is applied, enhancing the stability may be desirable even when the power factor is somewhat sacrificed.

<4. Characteristic Effects>

According to the plasma-generation power-supply device 100 of the first preferred embodiment, the frequency of the inverter IV is varied in accordance with the target applied power, which enables highly efficient driving operation and allows reduction of the power-supply capacity of the inverter, thus achieving both of cost reduction and stable control of discharge.

Also, the frequency of the inverter is varied depending on the condition, and it is therefore possible to achieve the target applied power even if the inductance value of the circuit including the reactor varies, by controlling the frequency of the inverter IV with the controller CT on the basis of the current flowing to the ozonizer 1 measured by the current detector DT.

This means that there is no need for a very precise reactor, allowing reduction of costs of the reactor or reduction of costs for a highly precise reactor.

<5. Modification 1>

The plasma-generation power-supply device 100 of the first preferred embodiment has shown a structure in which the controller CT controls the inverter IV to achieve frequency and duty most suitable for the resonance condition of the load, on the basis of the flowing current to the ozonizer 1 detected by the current detector DT. However, varying the frequency is equivalent to controlling the relation between the driving waveform and the resonance point corresponding to the load condition. Accordingly, the same effect can be obtained with structures other than the structure that varies the frequency.

Figure 6:
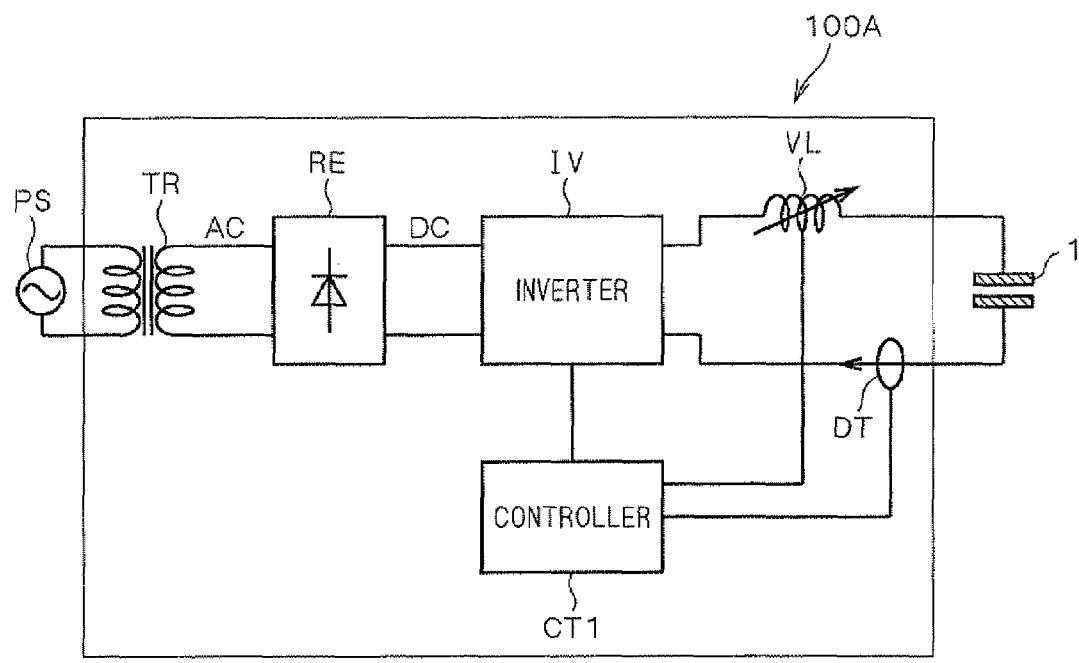
[FIG. 6] A diagram showing a modification of the configuration the preferred embodiment of the invention.

One example is a structure that varies the circuit constant, and FIG. 6 shows a plasma-generation power-supply device 100A in which a variable reactor VL (a variable passive element) is inserted in series with the load (ozonizer 1). As shown in FIG. 6, the variable reactor VL is connected to a controller CT1 and its inductance value can be varied by the controller CT1.

Also in this structure, the variable passive element is variably controlled according to the target applied power to the discharging load so that the target power can be applied to the discharging load.

The same components as those of the plasma-generation power-supply device 100 of FIG. 4 are shown at the same reference characters and not described here again.

By adopting this structure, the resonance point of the circuit can be varied even when the inverter frequency cannot be varied, and the same effect as varying the power-supply frequency is obtained.

<6. Modification 2>

Figure 7:
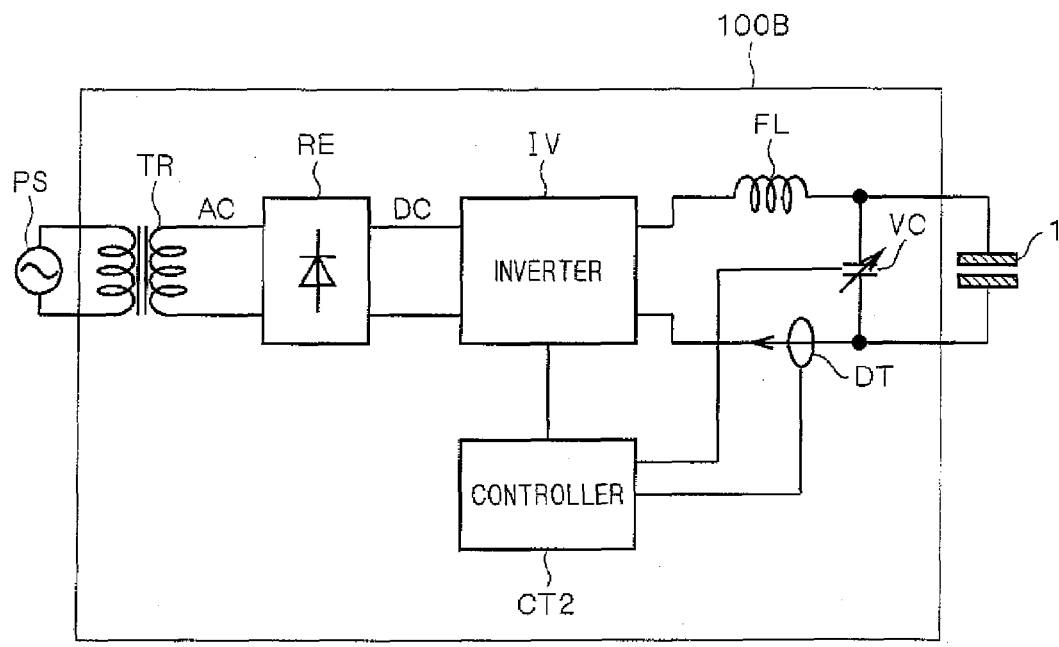
[FIG. 7] A diagram showing a modification of the configuration of the preferred embodiment of the invention.

As to another structure that varies the circuit constant to vary the resonant frequency of the load, the structure as shown in FIG. 7 as a plasma-generation power-supply device 100B may be adopted, where a variable capacitor VC (a variable passive element) is connected in parallel with the ozonizer 1 and its capacitance value can be varied by a controller CT2.

The same components as those of the plasma-generation power-supply device 100 of FIG. 4 are shown at the same reference characters and not described here again.

In both of the modification 1 and modification 2, the variable passive element is variably controlled so that the current at the power-supply output end is delayed in phase with respect to the voltage, whereby the discharge can be controlled stably regardless of the value of the duty.

As mentioned earlier, a problem of the conventional power-supply control system is due to the fact that the average electrostatic capacity Cγ of the ozonizer 1 varies depending on the applied power. Accordingly, the capacitance of the variable capacitor VC is controlled in order to correct the variation, i.e., in order to make constant the sum of the average electrostatic capacity Cγ of the ozonizer 1 and the capacitance of the variable capacitor VC, whereby the apparent circuit constant can be kept approximately constant and the discharge can be controlled stably.

<7. Modification 3>

As mentioned earlier, it is desirable for stable control of discharge that the load is an L-load when seen from the power-supply output end, but the entire circuit does not become an L-load unless some inductance component is added to the circuit, because the load of the dielectric barrier discharge, such as the ozonizer, is a capacitive load (C-load). The plasma-generation power-supply device 100 of FIG. 4 has the reactor FL connected in series with the load (ozonizer 1), but a reactor FL1 may be connected in parallel with the load as shown in a plasma-generation power-supply device 100C in FIG. 8. In this case, as in the plasma-generation power-supply device 100, the inverter IV is connected electrically directly to the reactor FL1. The same components as those of the plasma-generation power-supply device 100 of FIG. 4 are shown at the same reference characters and not described again here.

This structure, too, provides the effect that the power factor is enhanced by utilizing the resonance phenomenon and so the power-supply capacity of the inverter can be reduced.

A structure using series resonance, like the plasma-generation power-supply device 100, is suitable for applications that require high voltage for the discharge of the load, and the use of series resonance offers the effect that the voltage required for the power-supply can be reduced and so the power-supply capacity of the inverter can be reduced. On the other hand, a structure using parallel resonance, like the plasma-generation power-supply device 100C, is suitable for applications that require large current for the discharge of the load, and the use of parallel resonance offers the effect that the current required for the power-supply can be reduced and so the power-supply capacity of the inverter can be reduced.

In the plasma-generation power-supply device 100 of FIG. 4, the output voltage of the inverter IV is intactly applied to the load (ozonizer 1), and the discharge voltage and the discharge current of the ozonizer 1 are both large. When the discharge voltage is especially large, it is effective to reduce the necessary power-supply voltage by using series resonance.

<8. Modification 4>

Figure 9:
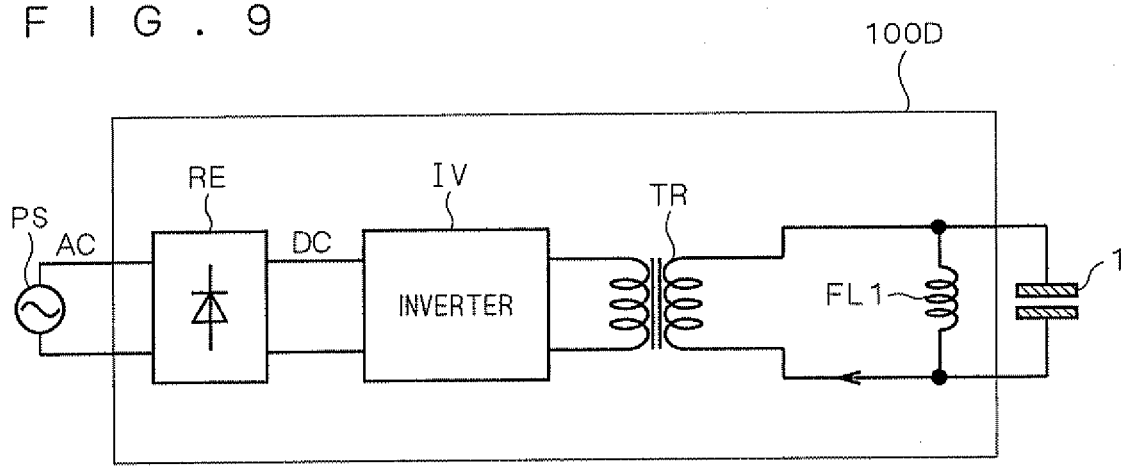
[FIG. 9] A diagram showing a modification of the configuration of the preferred embodiment of the invention.

In the first preferred embodiment and its modifications 1 to 3, the output voltage of the inverter IV is given intactly to the load (ozonizer 1), but, as shown in a plasma-generation power-supply device 100D in FIG. 9, a transformer TR may be provided following the inverter IV in order to boost the output of the inverter IV. In this case, the alternating-current power-supply PS is connected directly to the rectifier RE.

Figure 8:
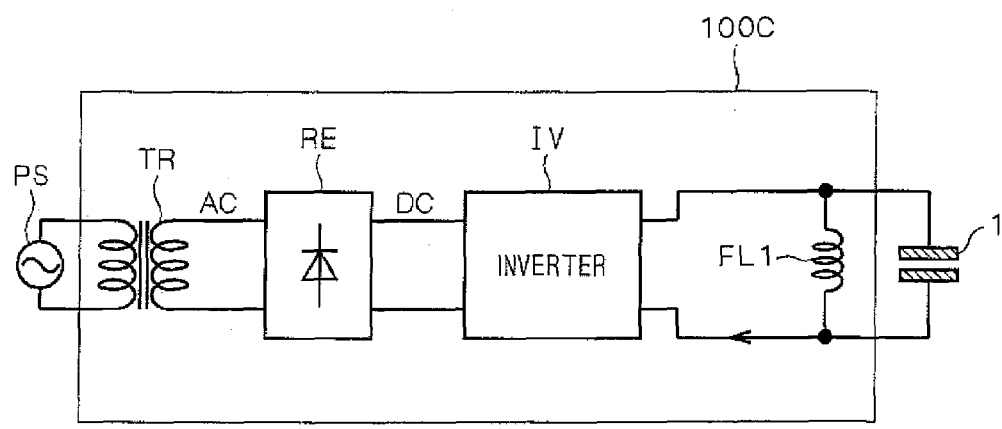
[FIG. 8] A diagram showing a modification of the configuration of the preferred embodiment of the invention.

The same components as those of the plasma-generation power-supply device 100C of FIG. 8 are shown at the same reference characters and not described here again.

Since ozonizers generally require high discharge voltage, it is necessary to boost the output by some means when the voltage of a common alternating-current power-supply PS is directly rectified. Accordingly, a structure in which the output of the inverter IV is boosted with the transformer TR, like the plasma-generation power-supply device 100D, can be adopted in some cases.

The plasma-generation power-supply device 100D shows an example in which the reactor FL1 is inserted in parallel with the load, but a reactor may be inserted in series with the load, or a leakage inductance or exciting inductance occurring in the transformer TR may be used in place of a reactor. Also, an inductance caused by the structure, such as the interconnection, may be used.

<9. Modification 5>

The first preferred embodiment and its modifications 1 to 4 have shown structures using an inverter as the power-supply. With inverters, it is easy to vary the applied power by PWM, and it is also technically easy to vary the frequency at the same time, and they are very suitable for the aim of varying the frequency according to the power, as is used in the present invention.

However, the power-supply is not limited to an inverter, and the same effect as that obtained by varying the power-supply frequency is obtained even when a constant-frequency power-supply is used, in which case a structure that varies the circuit constant to vary the resonant frequency of the load is adopted as described in the modifications 1 and 2.

Also, a variable-frequency power-supply that utilizes, e.g., a motor and a mechanical mechanism (e.g. variable-speed gears) may be used in place of an inverter or a constant-frequency power-supply.

For example, the commercial frequency of 60 Hz can be converted to another frequency with a structure in which a motor is rotated at the commercial frequency and a generator is rotated at a rate varied by a rate-changing mechanism including gears and belt, whereby the power generating frequency of the generator can be varied from 60 Hz.

<10. Effect to Suppress Variation of Discharge Characteristic>

With discharging loads like ozonizers, a phenomenon to be noticed is the variation of discharge characteristic. The discussion above did not particularly take the discharge characteristic variation into consideration, but, to begin with, the discussion "the discharge partially turns off for some reason" is made on the assumption that the discharge characteristic varies, and some area is less likely to discharge and that area turns off.

Accordingly, the following description examines why the discharge characteristic varies and explains that the present invention is effective even when the discharge characteristic varies.

First, the discharge characteristic variation will be described with the cylindrical ozonizer exemplified in FIG. 10.

Figure 10:
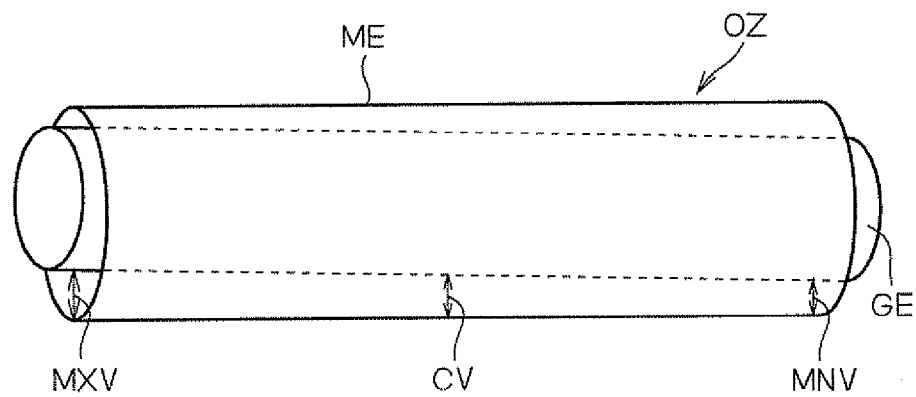
[FIG. 10] A diagram illustrating the structure of an ozonizer.

The ozonizer OZ shown in FIG. 10 includes an inner tube GE made of glass and plated with metal inside and an outer tube ME formed of a metal cylinder, and the ozonizer OZ is referred to as a cylindrical multi-tube type ozonizer. The two tubes are held at a uniform interval by, e.g., a spacer not shown, but the interval between the two varies for reasons of mechanical precision.

FIG. 10 assumes that the inner tube GE is somewhat inclined, and the interval between the inner tube GE and the outer tube ME is large in some part and it is small in other part.

The interval between the electrodes, i.e., the discharge gap, affects voltage for discharge, such as the discharge maintaining voltage $V^*$. In particular, recently, relatively small gap lengths (e.g., 0.4 mm) are adopted most commonly, and a varying gap interval exerts serious influences when the gap is this small.

FIG. 10 assumes that the gap interval has three values, i.e., a maximum value MXV, an intermediate value CV, and a minimum value MNV. When the gap interval thus varies, some area discharges while other area does not discharge even when the same discharge voltage (strictly, the same breakdown voltage) is applied. The area where a discharge occurs and is sustained corresponds to the discharging area shown in FIG. 3, and its ratio with respect to the entire region is the ratio of discharging area.

Figure 11:
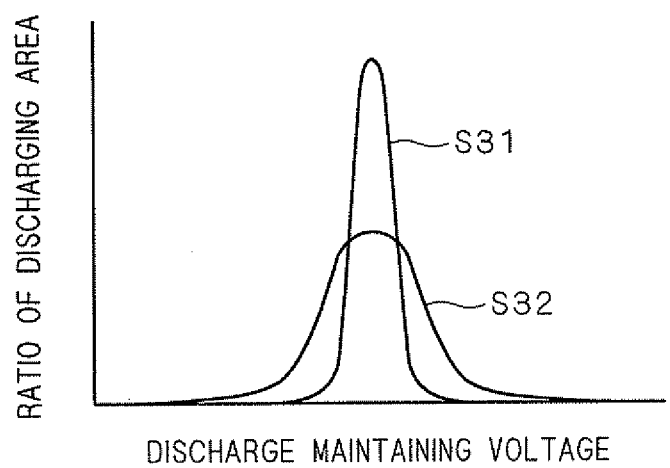
[FIG. 11] A diagram showing distributions of discharge maintaining voltage caused by a varying gap interval of the ozonizer.

Next, FIG. 11 shows distributions of the discharge maintaining voltage caused by varying gap intervals. In FIG. 11, the horizontal axis shows the discharge maintaining voltage and the vertical axis shows the ratio of discharging area.

The discharge maintaining voltage is lower than the breakdown voltage. That is, when a discharge is once established by application of the breakdown voltage, the discharge is self-sustained even when the voltage is decreased. This voltage necessary to maintain the discharge is the discharge maintaining voltage.

In FIG. 11, the distribution curve S31 shows a distribution exhibited when the gap interval varies slightly, and the distribution curve S32 shows a distribution exhibited when the gap interval varies greatly.

The distribution curve S31 has a narrow distribution width and a high peak, and the distribution curve S32 has a wide distribution width and a low peak. This shows that, when the gap interval varies less, the discharge is sustained in a narrower voltage range around a certain discharge maintaining voltage, while the discharge maintaining voltage is distributed in a wider range when the gap interval varies more.

Now, referring to FIGS. 12 and 13, how the stability of the discharge varies when the discharge maintaining voltage is thus distributed will be described.

Figure 12:
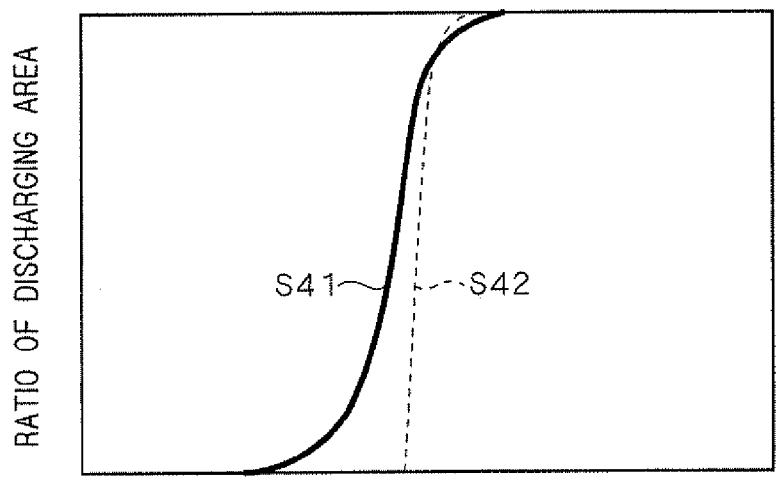
[FIG. 12] A diagram used to explain the stability of discharge with distributed discharge maintaining voltage.
Figure 13:
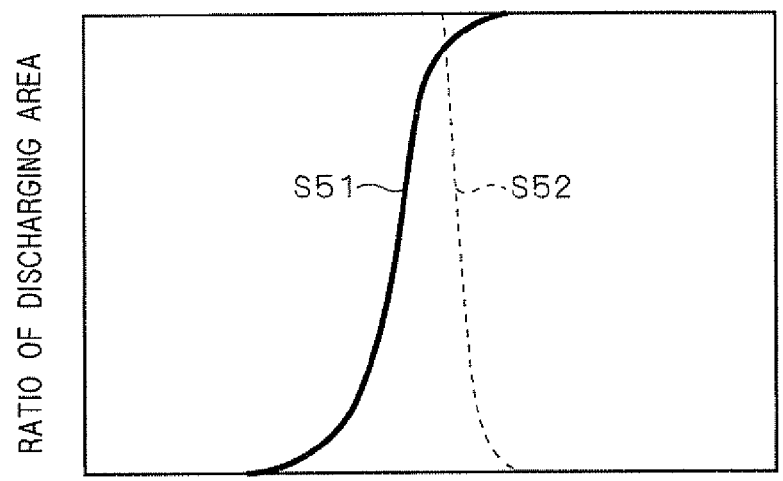
[FIG. 13] A diagram used to explain the stability of discharge with distributed discharge maintaining voltage.

In FIGS. 12 and 13, the horizontal axis indicates the discharge maintaining voltage and the voltage applied to the gap (the in-gap, partial voltage of the applied voltage) and the vertical axis indicates the ratio of discharging area.

FIGS. 12 and 13 show characteristic curves S41 and S51 with solid line and characteristic curves S42 and S52 with dotted line, where the characteristic curves S41 and S51 show the integral curves of the discharge maintaining voltage distribution indicating variations of discharge, and the characteristic curves S42 and S52 show the characteristics of the circuit.

The characteristic curves S42 and S52 show the variations of the applied voltage with respect to the variations of the discharging area as shown in FIG. 3, but the vertical and horizontal axes of FIG. 3 are exchanged in FIGS. 12 and 13, and the upper ends of FIGS. 12 and 13 correspond to the discharging area ratio of 100%, i.e., the right end of FIG. 3.

Then, the characteristic curve S42 of FIG. 12 shows a distribution like that of f=f1 and d=0.6 shown in FIG. 3, i.e., a distribution of the discharging area ratio exhibited when the inverter operates at a frequency lower than the resonant frequency corresponding to the applied power, where the circuit is not a stable L-load but is a C-load and the discharge is not controlled stably.

On the other hand, the characteristic curve S52 of FIG. 13 shows a distribution like that of f=f2 and d=0.4 shown in FIG. 3, i.e., a distribution of the discharging area ratio exhibited when the inverter operates at a frequency higher than the resonant frequency corresponding to the applied power, where the circuit is a stable L-load and the discharge is controlled stably.

In FIG. 12, when the intersection of the characteristic curves S41 and S42 is the operating point, it is seen from the slope of the curve S42 that a decrease in the discharging area ratio causes a decrease in the voltage in the gap. The decrease in the in-gap voltage means a decrease in the discharge maintaining voltage, and it is then seen from the curve S41 that the discharging area ratio decreases. The decrease in the discharging area ratio decreases the in-gap voltage, and then a decrease in the discharging area and a decrease in the in-gap voltage alternately occur and the discharge will finally turn off or goes out in the entire area.

On the other hand, with the characteristic curves S51 and S52 of FIG. 13, it is seen from the slope of the curve S52 that a decrease in the discharging area ratio increases the in-gap voltage. This means that the discharge turns on again even when it once turns off, which means that the discharging area is prevented from decreasing.

In this way, while the C-load state shown in FIG. 12 indicates an unstable condition, the L-load state shown in FIG. 13 indicates a stable condition and also shows that the plasma-generation power-supply device of the invention, which provides control to vary the inverter frequency in accordance with the target applied power, plays an important role for stable control of the discharge.

In FIGS. 12 and 13, the intersections as the operating points are not located at the top. This means that the ratio of discharge is not 100% and the discharge is off in some area, meaning that the gap is extremely large in some part (like MXV of FIG. 10) and causing a discharge in that area is very difficult. Even in such a condition, the use of the present invention enables stable control.

Also, when the applied power is lowered, then the voltage applied to the gap becomes lower, and then the distribution of discharge maintaining voltage is often a problem to be dealt with, and the present invention is effective especially when the power is low.

<11. Specific Example of Stable Control>

The description above has explained about stably controlling the discharging load by controlling the frequency according to the target applied power value, and the relation between the discharge power and frequency will now be specifically described below.

<11-1. Range of Variations of Frequency and Duty>

First, the range of variations of frequency and duty will be described.

Figure 14:
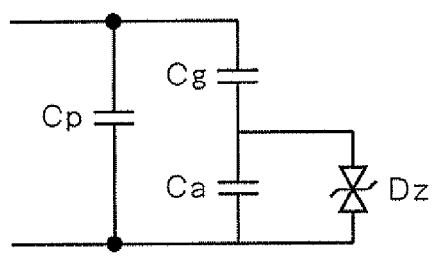
[FIG. 14] A diagram showing an equivalent circuit of a discharging load utilizing dielectric barrier discharge.

FIG. 14 is a diagram illustrating an equivalent circuit of the discharging load utilizing dielectric barrier discharge driven at low frequencies, typical examples of which are ozonizers and flat-plate light sources.

As shown in FIG. 14, the discharging load has an electrostatic capacity Cg of the dielectric interposed between the electrodes (its capacity value is denoted as Cg), and an electrostatic capacity Ca of the gas region (its capacity value is denoted as Ca). The discharging load further has a floating electrostatic capacity Cp existing because of the structure of the load (its capacity value is denoted as Cp).

In an ozonizer, the value of Cp is generally sufficiently small and negligible, but the value is large in, e.g., surface-discharge plasma display panels.

Also, in FIG. 14, oppositely disposed Zener diodes Dz are connected in parallel with the electrostatic capacity Ca in order to equivalently show the plasma load that has non-linearity due to the generation/disappearance of plasma.

In a low-frequency dielectric barrier discharge, typically, that of an ozonizer, the applied power Poz for discharge is given by Expression (3) below.

[Expression 3]

$$Poz = 4CgV^* f\left(VO_p - \left(1 + \frac{Ca}{Cg}\right)V^*\right) \tag{3}$$

Expression (3) expresses a relation among the peak value VOp of the applied voltage, frequency f, and applied power Poz.

Also, Expression (1) shown earlier expresses a relation among circuit's electrostatic capacity, inductance, and resonant frequency.

Now, the inductance is the value of the reactor provided in series or parallel with the load, and the electrostatic capacity is the average electrostatic capacity Cγ of the load. Cγ is represented by Expression (2) and depends on the peak value VOp of the applied voltage.

Accordingly, the applied power Poz that attains the resonance point at the frequency f0 is obtained by eliminating VOp and Cγ from Expressions (1), (2) and (3).

[Expression 4]

$$Poz = 4Cg(V^*)^2 f\left(\frac{Cg}{Cg + Cp - \frac{1}{L(2\pi f)^2}} - \left(1 + \frac{Ca}{Cg}\right)\right) \tag{4}$$

Expression (4) above shows a condition in which the power-supply frequency and the resonant frequency coincide with each other (f=f0).

The Expression (4) is also an expression that obtains the resonant frequency of the circuit with respect to a certain target applied power Poz. From the discussion given so far, it is desirable for stable control to drive the inverter at a frequency higher than the resonant frequency.

In other words, a criterion is obtained that the inverter should be driven at a frequency higher than the resonant frequency given by Expression (4) in order to stably control the discharging load.

The resonant frequency given by Expression (4) is, so to speak, the lower limit value of the power-supply frequency, and the upper limit of the power-supply frequency will now be described below.

The resonant frequency with power of zero is seen from Expression (4). That is, this is the resonant frequency with the electrostatic capacity Cβ in a non-discharging state. This resonant frequency fmax is given by Expression (5) below.

[Expression 5]

$$f_{max} = \frac{1}{2\pi\sqrt{LC_\beta}} \tag{5}$$

The resonant frequency of the circuit does not become larger than fmax, and it is therefore appropriate to set the maximum value of the power-supply frequency at a value close to fmax.

Figure 15:
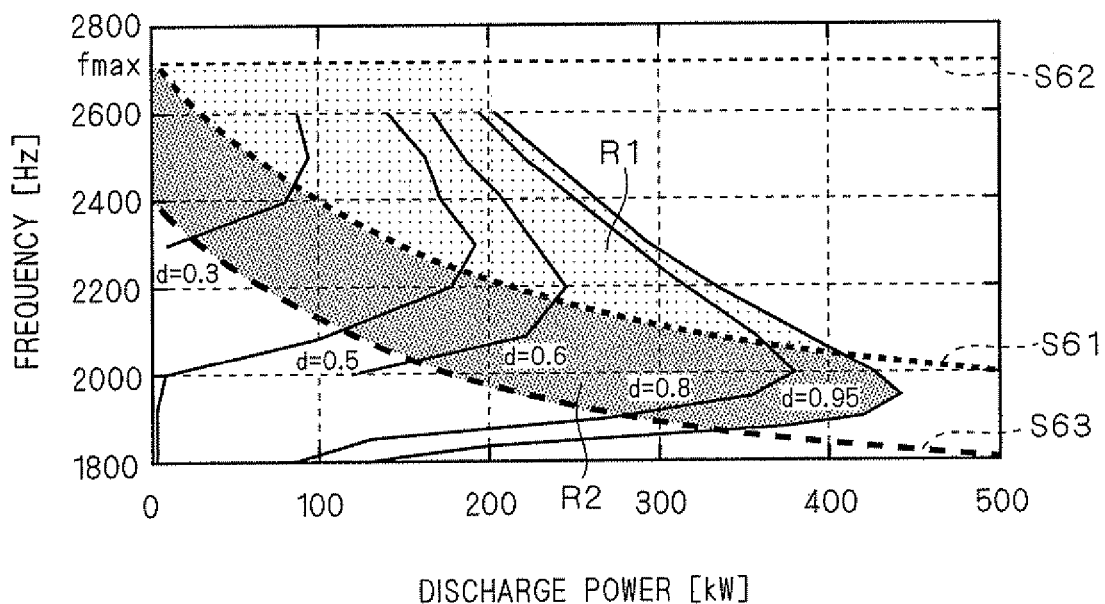
[FIG. 15] A diagram showing a relation between inverter output waveform and discharge power.

Next, FIG. 15 shows the results of computation with a circuit simulator about a relation between the output waveform of the inverter IV and the discharge power in the plasma-generation power-supply device 90 described with FIG. 1.

In FIG. 15, the horizontal axis shows the discharge power (unit: kW) and the vertical axis shows the frequency (unit: Hz), and FIG. 15 shows discharge power variations at a plurality of duties of the inverter IV, where the duties are kept constant and the frequency is varied. Specifically, the graph shows characteristic curves with d=b 0.3, d=0.5, d=0.6, d=0.8, and d=0.95.

FIG. 15 corresponds to a graph in which the vertical and horizontal axes of the frequency characteristic of the applied power of FIG. 5 are exchanged.

It is seen from FIG. 15 that decreasing the duty increases the resonant frequency. The line connecting the peaks of the discharge power vs. frequency characteristic curves form a borderline. This borderline corresponds to the curve S61 given by Expression (4).

The curve S61 and the line connecting the variation characteristic peaks do not perfectly coincide with each other. One reason for this is that the computation with a circuit simulator was done with fixed duties, but Expression (4) was obtained with fixed discharge power. Anyway, the frequency region higher than the curve S61 is a region where the discharge can be stably controlled.

Also, the upper limit of the power-supply frequency is defined by Expression (5), and it is shown by straight line S62 in FIG. 15.

The upper limit of the discharge power differs depending on the frequency, but the discharge power vs. frequency characteristic curve with the maximum duty indicates the upper limit of the discharge power at each frequency. Thus, in FIG. 15, the range of frequency variation for obtaining desired discharge power is shown as a lightly-hatched first region R1.

Now, Expression (4) giving the lower limit value of the frequency is considered. First, the results of computation with a circuit simulator with fixed duties somewhat differ from Expression (4), and also, real power-supplies usually undergo some constant-power control and are controlled sufficiently stably even if the discharge is somewhat unstable.

Accordingly, using the curve S61 given by Expression (4) as the lower limit of the stable control region is too strict a condition. From examinations based on operations of real ozonizers and results of some simulations, it is thought that the discharge can be sustained stably even at frequencies lower by about 10% than the frequencies given by Expression (4). Taking this into consideration, the stable control region is expanded to include the first region R1 and the densely-hatched second region R2.

On the other hand, as to Expression (5) giving the upper limit of frequency, there is no need for operating at frequencies higher than the upper limit, but no problems arise even when the frequency exceeds the upper limit. However, the power factor will decrease and setting a very large frequency variation range is undesirable for inverter and circuit designs, and therefore the upper limit is defined as a standard.

Thus, stable control can be achieved basically by selecting frequency and discharge power within the stable control region including the regions R1 and R2.

<11-2. Relation Between Discharge Power and Frequency for Optimum Stable Control>

Next, how to select a frequency in the stable control region for a particular discharge power value to achieve optimum stable control will be described referring to FIGS. 16, 17 and 18.

Figure 16:
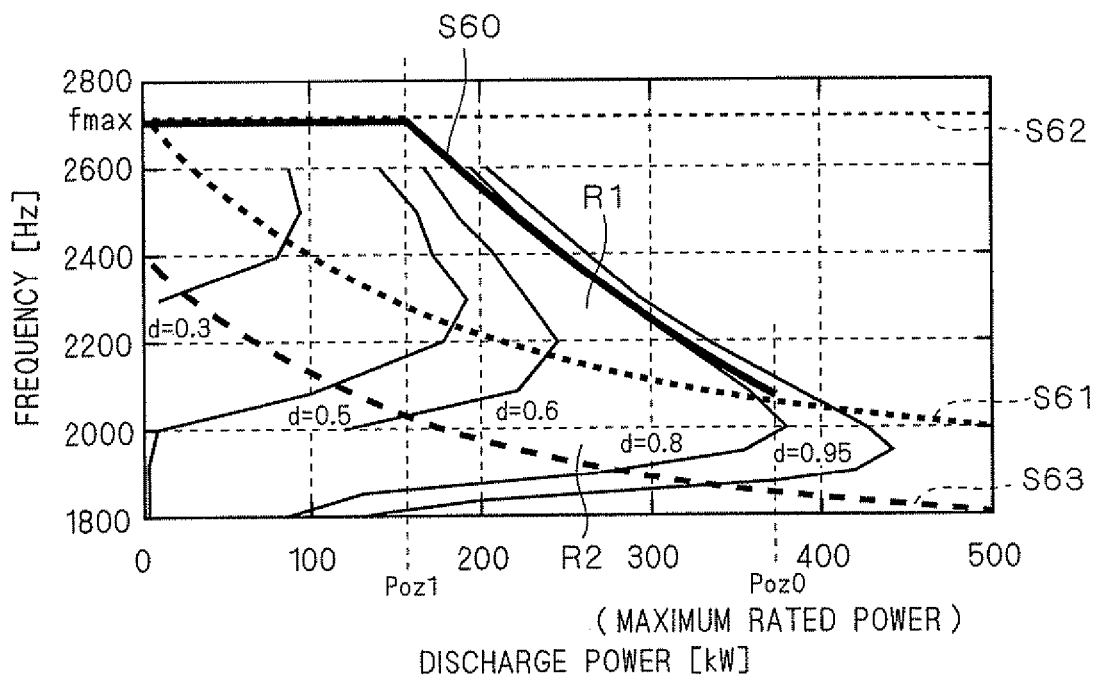
[FIG. 16] A diagram illustrating a relation between discharge power and frequency for achieving stable control.

FIG. 16 is basically the same as FIG. 15 but with no hatching. A maximum rated power Poz0 is defined in FIG. 16. This value is the power exhibited when the duty is close to the maximum value, i.e., d=0.95, and the frequency is set somewhat higher than the frequency corresponding to the maximum power (resonance point).

As explained with FIG. 15, stable control can be achieved basically by selecting frequency and discharge power within the regions R1 and R2, but some differences are produced depending on the route, even within the stable control region.

First, in conclusion, selecting the frequency and discharge power along the curve S60, denoted by bold line in FIG. 16, is the most effective for stable control.

The curve S60 nearly coincides with the upper end of the stable control region, and the curve S60 starts at the point on the curve S61 that corresponds to the maximum rated power Poz0, and extends along the characteristic curve with a constant duty (d=0.8 herein) such that the frequency increases as the target discharge power decreases, and is maintained at the constant frequency fmax after the frequency has reached the maximum frequency fmax (the power at this point is Poz1). When the frequency becomes constant at fmax, the power is controlled with duty, i.e., by PWM control.

A constant duty does not mean that the duty is not varied at all, but it means that the PWM control is performed by finely adjusting the duty in order to achieve constant-power control at individual points. Performing PWM control to finely control the power is a common scheme for inverters.

Next, why the route along the curve S60 is advantageous for stable control will be described. The route along the curve S60, which approximately coincides with the upper end of the stable control region, is the most distant from the resonant frequencies and directed toward the worst power factors, but selecting this route enables highest stability of the discharge.

On the other hand, as to the efficiency of the power-supply, the power factor of the power-supply is reduced, but it was found by a computation of inverter's switching and dissipation that the dissipation of the inverter does not necessarily become larger. On the contrary, it was found that the switching dissipation of the inverter is smaller on the route along the upper end of the stable control region than on other routes.

In particular, this applies to semiconductor elements in which switching dissipations are dominant over conduction dissipations (ON-state dissipations), or to frequencies for operating semiconductor elements such that the switching dissipations are dominant over the ON-state dissipations. The reason will be described below referring to FIGS. 17 and 18.

Figure 17:
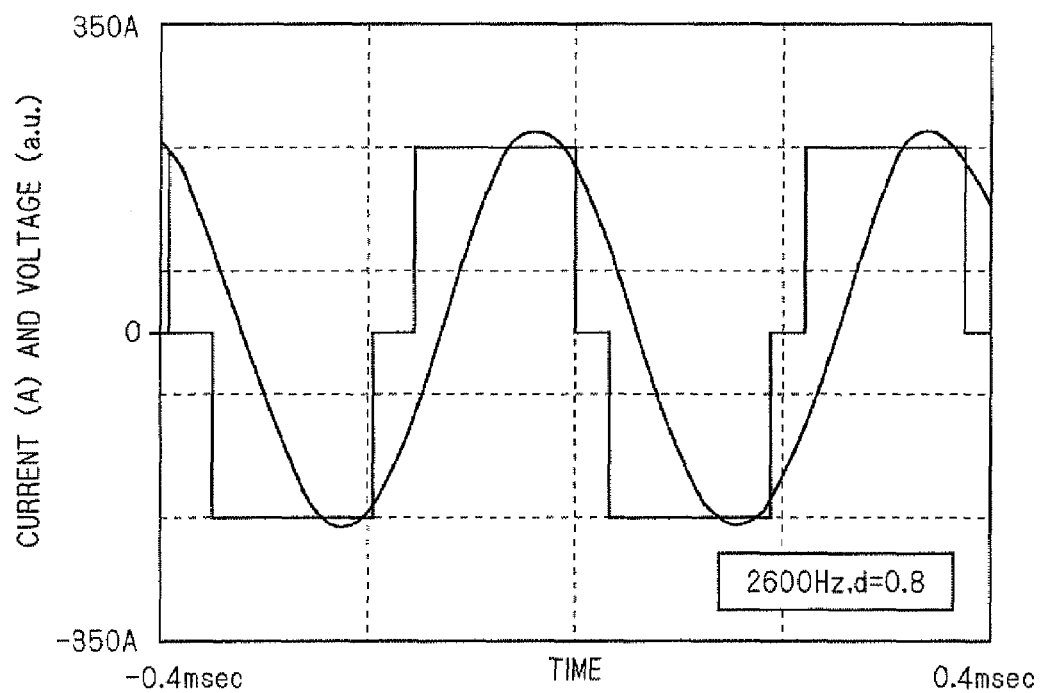
[FIG. 17] A diagram showing the results of a simulation about inverter's current and voltage waveforms in a stable control region.
Figure 18:
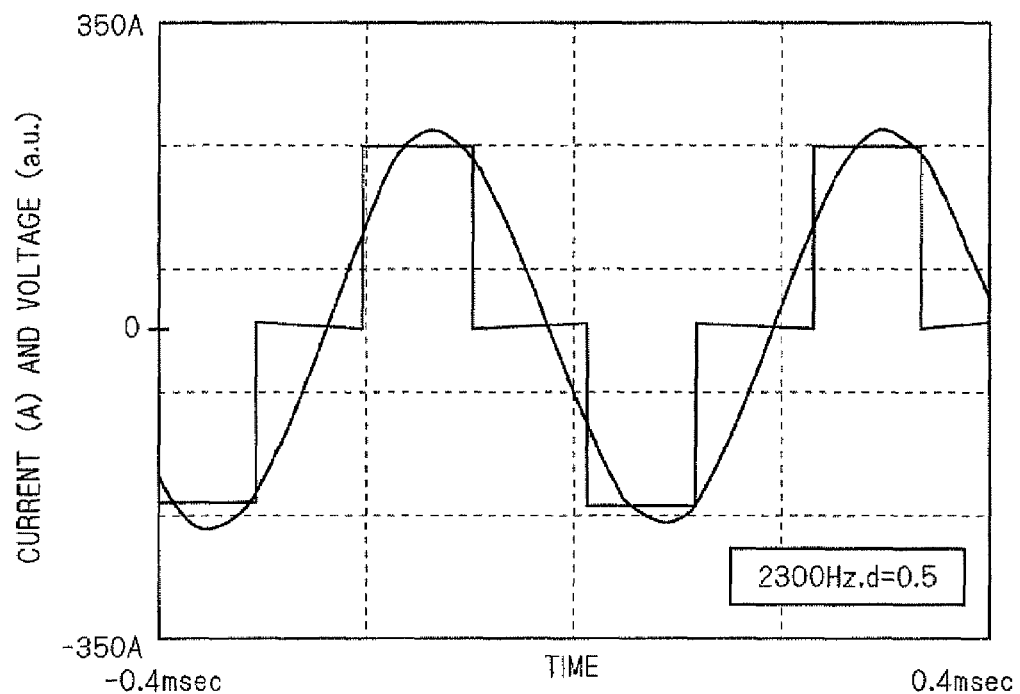
[FIG. 18] A diagram showing the results of a simulation about inverter's current and voltage waveforms in the stable control region.

FIGS. 17 and 18 show the results of circuit simulations about the current and voltage waveforms of the inverter IV at two points that provide output of about 180 kW within the stable control region shown in FIG. 15, i.e., at the point of frequency 2600 Hz with duty d=0.8 and the point of frequency 2300 Hz with duty d=0.5.

The current and voltage waveforms of FIGS. 17 and 18 are those at the output end of the inverter, and the voltage exhibits an almost perfect rectangular wave in both diagrams. In the diagrams, the vertical axis shows the current (A) and voltage (arbitrary unit), and the horizontal axis shows time (msec), where the maximum and minimum values of voltage are equal to the bus voltage of the inverter.

The point that exhibits the waveforms of FIG. 17 is on the curve S60 of FIG. 16, and the point that exhibits the waveforms of FIG. 18 is separated from the curve S60. Comparing the two diagrams shows that the voltage and current are closer in phase in FIG. 18, i.e., the power factor is closer to 1.

On the other hand, in FIG. 17, the current is considerably delayed with respect to the voltage, meaning a lagging phase or L-load. This means that the power factor is higher in FIG. 18 but the stability is higher in FIG. 17.

Now, a difference in power factor is not always equal to the magnitude of inverter's power dissipation that occurs in the semiconductor elements. As mentioned earlier, in such high-frequency switching, the problem is not the ON-state dissipations of the semiconductor elements but the switching dissipations.

That is, the switching dissipation is determined by the current value exhibited at the time of switching. In FIG. 17, when the voltage rises to positive value, the current remains at negative value. A negative value of current means that the current is flowing through a freewheeling diode provided together with the switching element and it has no relation with the switching element, i.e., no switching dissipation.

On the other hand, in FIG. 18, when the voltage rises to positive value, the current is at a fairly large positive value, and the current is flowing in the switching element and a switching dissipation is occurring.

Thus, the switching dissipation is small in FIG. 17 and the switching dissipation is large in FIG. 18.

In conclusion, the current and voltage waveforms of FIG. 18 are at a smaller duty than those of FIG. 17, and therefore the current and voltage are closer in phase and the power factor is higher, but as a result the switching current is larger and the switching dissipation is also larger.

Thus, selecting the route along the curve S60 reduces the power factor but suppresses the switching dissipation of the inverter, which enables more stable discharge and smaller switching dissipation.

Now, the duty to be constant is set at 0.8 in FIG. 17, and it is desirable to set it at a value somewhat smaller than the maximum settable value of the duty, more specifically, a value corresponding to 80% to 90% of the maximum duty value.

That is, while the frequency is determined for the applied power and that frequency is used for operation, a need to increase/decrease the duty unavoidably arises after the operation has started, because of the need for constant-power control. Accordingly, it is desirable to select a duty value having a margin for further increase.

Also, the frequency is not set higher than fmax, and the frequency fmax is used at and below the power Poz1 so that the frequency does not become unnecessarily high. That is, when the duty is fixed at 0.8 and the frequency is gradually increased, the power becomes zero theoretically at infinitely large frequency. Accordingly, when power is to be varied to the vicinity of zero, it is appropriate below a certain value of power to control the power by PWM control at a constant frequency. The constant frequency is selected within a range from the value of fmax of Expression (5) to a value corresponding to about 80% of fmax.

That is, in practice, stable control can be satisfactorily achieved at frequencies that are lower by 10 to 20% than fmax, without using such a high frequency as fmax. In this case, at low output, the condition enters the second region R2 shown in FIG. 15, but real operation was controlled sufficiently stably in practice.

<11-3. Specific Setting of Frequency and Duty>

Now, specific methods of setting and finely controlling the frequency and duty will be described.

First, the target applied power is determined and next a decision is made as to what range of frequencies should be used to achieve stable control, according to the stable control region described with FIGS. 15 and 16.

Then, the frequency and duty are determined considering the fact described referring to FIGS. 17 and 18, i.e., the fact that the stable control and minimized switching dissipation are achieved by selecting a condition offering a maximum frequency with a duty close to the maximum value within the stable control region.

Figure 19:
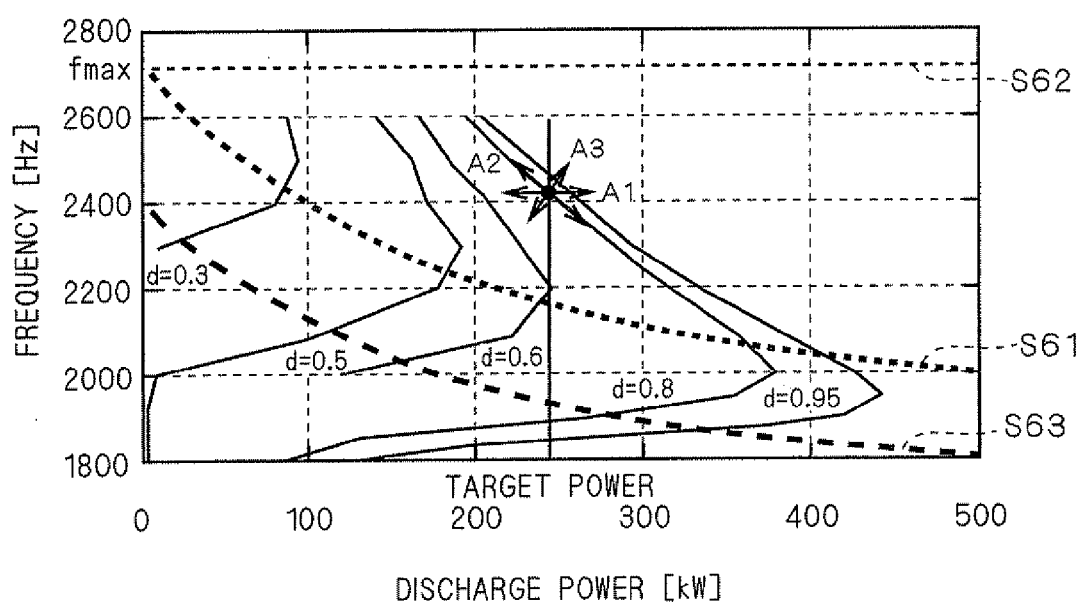
[FIG. 19] A diagram used to describe methods of feedback control of the inverter.

However, in real operations, the load varies because of various factors, and the operating condition of the discharging load is detected and a feedback control is applied on the basis of the detected results in order to keep the applied power constant While some methods of feedback control are applicable, examples thereof are described referring to FIG. 19.

FIG. 19 is basically the same as FIG. 15 but with no hatching. FIG. 19 illustrates a plurality of control methods that can be selected from an example point that corresponds to a target applied power on the characteristic curve of duty d=0.8.

<11-3-1. Constant Frequency Control>

In FIG. 19, the direction shown by arrow A1 indicates a method of control with fixed frequency.

That is, first, for the target applied power, the duty is set somewhat smaller than the maximum value in the stable control region. In the example of FIG. 19, the duty is set as d=0.8, and the frequency corresponding to the target applied power is selected, and the inverter is started at this frequency.

Then, in the constant-frequency control, when the flowing current or applied power to the load is measured and feedback control is applied to keep the power constant as described with FIG. 4, the duty is finely adjusted to adjust the power, with the frequency fixed at the selected frequency.

This method is advantageous in that the common inverter control method, PWM, can be used to finely adjust the power.

<11-3-2. Constant Duty Control>

In FIG. 19, the direction shown by arrow A2 indicates a method of control by varying the frequency while keeping the duty constant.

That is, first, with respect to the target applied power, the duty is set within the stable control region. In the example of FIG. 19, the duty is set as d=0.8, and the frequency corresponding to the target applied power is selected, and the inverter is started at this frequency.

Then, from this frequency, the frequency is finely adjusted to feedback-control the power. When the frequency is finely adjusted along the curve S60 of FIG. 16, the duty is set at a largest possible value.

The plasma-generation power-supply device 100, described with FIG. 4, has shown a structure in which the frequency of the inverter IV is finely controlled with the controller CT, in which case the matching state can be dynamically controlled by using, e.g., a phase locked loop (PHL) as the controller CT, and which offers optimum control regardless of the condition of the load.

This method is effective in a region where the applied power is small and the electrostatic capacity of the load is likely to vary and deviate from expected values.

Also, when the applied power is close to the maximum value, for example, it is necessary to apply a high voltage to the load at a frequency as close to the circuit's resonance point as possible. In this case, if the electrostatic capacity of the load varies, even a slight deviation from matching causes a great variation of the voltage applied to the load, and then the target applied power cannot be applied. The method of controlling by varying the frequency is effective in such a case because it can recover the matching merely by slightly adjusting the frequency.

It was mentioned earlier that frequencies over fmax are not used, but, as also mentioned earlier, exceeding the frequency fmax causes no problem in the range of fine adjustment of the frequency.

Needless to say, different control methods may be used above and below the frequency fmax, or above and below the target applied power, in which case, for example, the control method may be changed to use the frequency control with fixed duty above the target applied power and the duty control with fixed frequency under the target applied power.

In the method that controls frequency with fixed duty, the duty is kept constant and therefore the first value of the duty can be set at a maximum value (e.g. d=0.95), and this method is advantageous because it allows larger applied power and ample power application capability.

<11-3-3. Duty and Frequency Control>

In FIG. 19, the direction shown by arrow A3 indicates a method that controls the duty and frequency at the same time.

This method is effective when there is a demand to keep the power factor constant, for example, and how to vary one when the other is varied can be determined using a map, table, or the like previously created about the relation among the three factors including duty, frequency, and target applied power, and the inverter is controlled on the basis of the information.

<12. Jump of Voltage>

There are some important factors about the plasma-generation power-supply devices 90 and 100 described referring respectively to FIGS. 1 and 4.

In the plasma-generation power-supply device shown in FIG. 12 of Patent Document 1, a transformer is provided between the inverter and the ozonizer.

More specifically, an alternating current of 200V or 400 V at a commercial frequency is received from an alternating-current power-supply PS, and it is converted to a direct current through a rectifier and supplied to the inverter. Accordingly, the inverter bus voltage is several hundred V and the output of the inverter provides an alternating waveform of several hundred V.

Because operating the ozonizer requires a voltage of several kV, a step-up transformer is provided between the inverter and the ozonizer to boost the inverter output voltage, whereby the voltage of several hundred V outputted from the inverter is converted to an alternating voltage of several kV required for the ozonizer.

This structure is adopted because the ozonizer generally requires application of very high voltage of several kV and it is difficult for the inverter to directly generate a voltage waveform having such a high peak value. Accordingly, the inverter is first driven at a low voltage and then the voltage is boosted with the transformer.

More specifically, ozonizers generally produce a dielectric barrier discharge in air or oxygen at atmospheric or higher pressures. The gap length cannot be made very short because of reasons of mechanical precision, and it is 0.1 mm or more and generally around 0.4 mm. Also, the discharge is established through a dielectric and so the externally applied voltage is unavoidably as high as several kV. Common inverters are unable to directly generate such high-frequency high voltage, and so a transformer is needed to boost the voltage.

On the other hand, in the plasma-generation power-supply devices 90 and 100 shown respectively in FIGS. 1 and 4, no transformer is provided between the inverter IV and the ozonizer 1, and the output voltage of the inverter IV is given directly to the reactor FL.

In this structure, an alternating current with a voltage of 200 V or 400 V at a commercial frequency, for example, is first boosted by the transformer TR and then converted to a direct current by the rectifier RE.

At this stage, a direct voltage of, e.g., around 2 kV, is obtained and switched by the inverter having a kV-class breakdown voltage, whereby an alternating voltage waveform having a peak value of, e.g., around 2 kV, is obtained as the inverter output.

This alternating voltage is applied to the two electrodes of the ozonizer 1 through the reactor FL connected in series with the ozonizer 1. The resonance of the reactor FL and the electrostatic capacity of the ozonizer causes the voltage at the two electrodes of the ozonizer 1 to become much higher than the inverter output, and a high voltage, e.g., around 8 kV, is applied to the two electrodes of the ozonizer 1.

The structure of the plasma-generation power-supply devices 90 and 100 shown in FIGS. 1 and 4 has become possible because of the following two reasons: firstly, an inverter using high-voltage switching elements capable of directly switching a voltage of 1 kV or more are now available to directly generate a voltage waveform having a peak value of several kV or more; and secondly, the resonance phenomenon of the discharging load and the reactor FL connected in series with the ozonizer 1 (discharging load) can be used to cause a jump of the voltage applied to the two electrodes of the ozonizer 1.

Now, in which respects the structure of the plasma-generation power-supply devices 90 and 100 is advantageous will be described.

In the conventional system as shown in Patent Document 1, the step-up transformer interposed between the inverter and the ozonizer has a high step-up ratio and high breakdown voltage, and is generally very expensive and large in dimensions. Eliminating the need for the transformer allows considerable size reduction of the entire power-supply device or reduction of its installation area, and also allows cost reduction of the power-supply device.

While the plasma-generation power-supply devices 90 and 100 include a transformer TR immediately preceding the rectifier RE, the transformer TR can be one for use at commercial frequency, and its step-up ratio and breakdown voltage can be low and it needs relatively low costs.

Also, when a transformer is connected in parallel with the discharging load, the exciting inductance of the transformer is always present in parallel seen from the discharging load. That is, in this structure, a parallel resonance effect is unavoidably produced and the voltage cannot jump with ideal series resonance. On the other hand, in the plasma-generation power-supply devices 90 and 100, no transformer is connected in parallel with the discharging load, and therefore there is no influence of exciting inductance, and more ideal series resonance can be realized.

The description above has assumed that the alternating-current power-supply PS uses a commercial power-supply of a voltage of 200 V or 400 V, but it is possible in large-scale factory plants and the like to receive a voltage over 1 kV directly from the power-transmission line, in which case the inverter bus voltage may be generated on the basis of the received high voltage. In this case, the transformer preceding the rectifier RE is not needed.

Next, the high-voltage switching elements used for the high-voltage inverter will be described.

In general, Insulated-Gate Bipolar Transistors (IGBTs) are advantageous for high-voltage switching. One merit of the IGBT is that the on-state voltage of the IGBT is constant independently of the voltage applied to the IGBT. This means that, in high-voltage switching, the voltage difference applied to the IGBT, i.e., the voltage drop at the IGBT, is small.

This is apparently equivalent to a reduction of inverter's internal resistance. As a result, the resistance dissipation of the inverter becomes smaller, and this merit is especially important for the present invention that combines an inverter and a resonance circuit. That is, the sharpness of resonance and the voltage jump rate of the resonance greatly depend on the resistance component of the circuit. Accordingly, a smaller resistance dissipation in the inverter further sharpens the resonance. In other words, high-voltage inverters using IGBTs are suitable for boosting circuits using resonance.

An ozonizer is usually used with its one electrode grounded for a structural reason, and the potential of the inverter varies according to the output waveform. Therefore, some insulating means is needed between the inverter and the electricity receiving portion.

For example, in the plasma-generation power-supply devices 90 and 100 shown in FIGS. 1 and 4, the transformer TR is provided between the electricity receiving portion and the rectifier RE, and the insulating means can be realized by using an insulated transformer TR in which the primary and secondary sides are electrically insulated from each other. The structures shown in FIGS. 1 and 4 are advantageous also in this respect.

Ozonizers are generally operated at high frequencies of several kHz and therefore inverters for driving the ozonizers switch at high frequencies of several kHz. In the conventional structure as shown in Patent Document 1, high-frequency noise from the inverter may leak to the power system through the electricity receiving portion because the electricity receiving portion and the inverter are separated only by the rectifier. Accordingly, various filters are provided to solve this problem, and this results in an increase of costs.

On the other hand, in the plasma-generation power-supply devices 90 and 100 shown in FIGS. 1 and 4, the inverter IV and the electricity receiving portion are separated not only by the rectifier RE but also by the transformer TR. Furthermore, as mentioned above, the primary and secondary sides of the transformer TR are electrically insulated. In this structure, the high-frequency noise from the inverter IV is less likely to be conducted to the electricity receiving portion. In other words, in the plasma-generation power-supply devices 90 and 100, the transformer TR in the input section provides both of insulating function and high-frequency preventing function. Thus, no filter is required or a simple filter suffices as a measure against noise, which allows cost reduction of the entire device.

For the prevention of noise, it is also necessary to consider harmonic content generated in a high-frequency transformer. As shown in Patent Document 1, when a transformer is provided between an inverter and a discharging load, the transformer serves as a high-frequency transformer, and the transformer unavoidably generates harmonic content during operation.

When high-frequency current flows to the transformer, harmonic noise is produced due to the floating capacity of the transformer during the charging/discharging of the discharging load. When it leaks to the power system, it affects the power system and other equipment. Accordingly, the use of a high-frequency transformer requires considering generation of high-frequency components like harmonic noise, and requires taking some measures against the noise, but the plasma-generation power-supply devices 90 and 100, using no high-frequency transformer, requires no such measures.

As described so far, in the plasma-generation power-supply device of the invention, no transformer is provided between the inverter and the ozonizer, and an alternating waveform of high voltage is generated directly in the high-voltage inverter and supplied directly to the resonance means including the reactor FL, and the voltage is made to jump by the resonance circuit. This structure is highly advantageous in driving an ozonizer that is operated at high frequencies of several kHz and that requires voltage of several kV.

Optimizing the voltage jump by resonance is an important factor, and the optimization of voltage jump will be described below.

How the applied power to the load (i.e. discharge power) varies with varying frequencies has been described earlier referring to FIG. 5. As shown in FIG. 5, the discharge power has a peak at a certain point when the frequency is varied. Then, from Expression (3) representing a relation between the applied power Poz and the applied voltage peak value V0p in dielectric barrier discharge, it is seen that, ideally, the discharge power increases one-dimensionally with respect to the applied voltage peak value, which means that the voltage has a peak value at a particular frequency This shows that the circuit comes in a resonance state at this particular frequency, which means the jump of the voltage.

One of the characteristics of the present invention is that the alternating voltage switched in the inverter is applied to the two electrodes of the ozonizer by the resonance circuit. A discussion is given below to show the extent of voltage applicable to the electrodes of the ozonizer in this circuit structure, and also to show whether the above-mentioned conditions of the load can be satisfied in this circuit structure.

<12-1. Applicable Voltage>

First, voltage that can be applied to the ozonizer will be examined.

Suppose the inverter's bus voltage is Vd and the inverter's duty is d. In this case, the effective value of voltage, Vdrms, is given as $$Vdrm = \sqrt{d} \times Vd.$$

When the peak value of the sine wave of the same effective value (which is referred to also as inverter output voltage) is V0, then, $$V0 = \sqrt{2} \times Vdrms = \sqrt{2d} \times Vd.$$

The discharge power of the ozonizer is given by Expression (3), and an average current flowing to the ozonizer is given by Expression (6) below.

[Expression 6]

$$I_{rms} = \frac{Poz}{V^*} + 4fCaV^* + 4fCpVp \quad (6)$$

The average voltage, i.e., Vdrms, is then given by Expression (7) below.

[Expression 7]

$$V_{drms} = \frac{Poz}{I_{rms}} = \frac{\frac{V_p}{V^*} - \left(1 + \frac{Ca}{Cg}\right)}{\left(1 + \frac{Cp}{Cg}\right)\frac{V_p}{V^*} - 1} V^* \quad (7)$$

Now, when the voltage jump rate M is defined as a ratio between the peak value Vp of the voltage across the electrodes of the ozonizer (which is referred to also as a load peak voltage) and the peak voltage V0 of the effective sine wave (the ratio is Vp/V0), then the voltage jump rate M is given by Expression (8) below.

[Expression 8]

$$M = \frac{V_p}{V0} = \frac{1}{\sqrt{2}} \frac{\left(1 + \frac{Cp}{Cg}\right)\frac{V_p}{V^*} - 1}{1 - \left(1 + \frac{Ca}{Cg}\right)\frac{V^*}{V_p}}$$

$$= \frac{1}{\sqrt{2}} \frac{1 - \left(1 + \frac{Ca}{Cg}\right)\frac{\sqrt{2} V^*}{V0}}{\left(1 + \frac{Cp}{Cg}\right)\frac{V0}{\sqrt{2} V^*} - 1} \quad (8)$$

This indicates a voltage that can be applied to the electrodes of the ozonizer when the frequency of the power-supply is set at the resonant frequency of the circuit.

Figure 20:
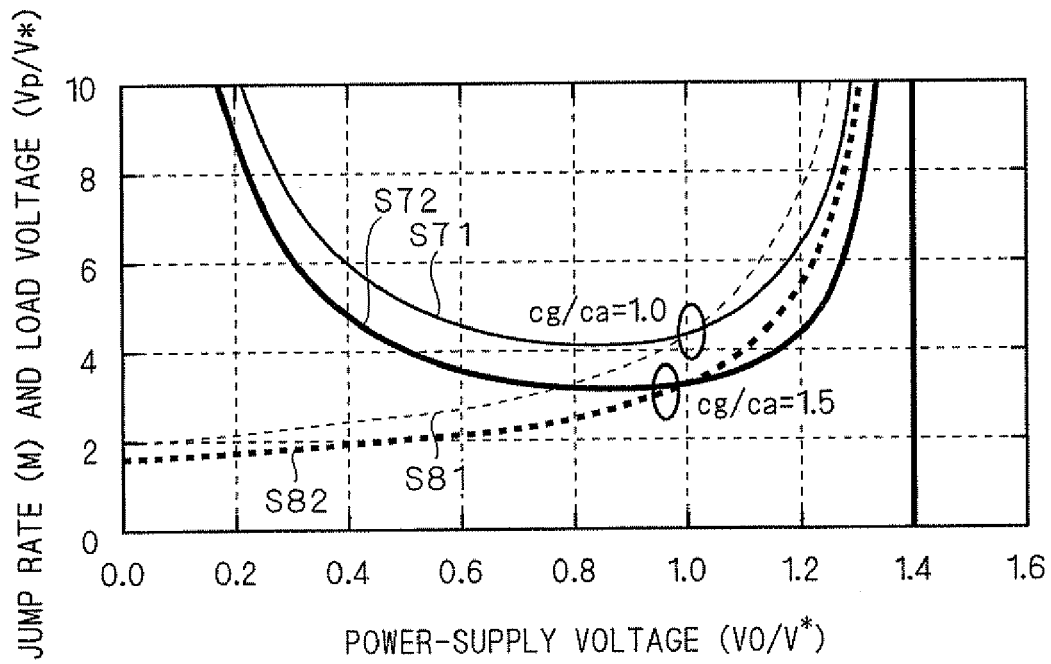
[FIG. 20] A diagram showing a relation among load voltage, power-supply voltage, and jump rate.

FIG. 20 shows a relation among the voltage applied to the load, power-supply voltage, and jump rate. In FIG. 20, the horizontal axis shows the ratio between the discharge maintaining voltage V* and effective sine wave peak voltage V0, and the vertical axis shows the jump rate M and the ratio between the discharge maintaining voltage V* and load voltage Vp. It is assumed that the floating electrostatic capacity Cp is zero.

As can be seen from Expression (8), the jump rate M is a function of the values of the electrostatic capacities that depend on the structure of the ozonizer, the discharge maintaining voltage V*, and the peak value V0 of the effective sine wave.

FIG. 20 shows variations of the jump rate M caused when the effective sine wave peak voltage V0 is varied, where the characteristic curves S71 and S72 respectively show the variations occurring when the ratio between the dielectric's electrostatic capacity value Cg and the gas region's electrostatic capacity value Ca is Cg/Ca=1.0 and Cg/Ca=1.5.

FIG. 20 also shows variations of the load voltage exhibited when the peak voltage V0 of the effective sine wave is varied, i.e., variations of the load peak voltage Vp, where the characteristic curves S81 and S82 show the variations respectively with Cg/Ca=1.0 and Cg/Ca=1.5.

It is seen from the characteristic curves S71 and S72 that the curves of the jump rate M have minimum values at certain points, though the voltage applied to the electrodes of the ozonizer, i.e., the discharge maintaining voltage V*, naturally increases as the peak voltage V0 of the effective sine wave increases.

When voltage is applied to supply power to the ozonizer, the effective sine wave peak voltage V0 is increased, to the right in FIG. 20. In this case, as can be seen from the characteristic curves S71 and S72, the power applied to the load increases and the load becomes more like a C-load, and so the jump rate M becomes larger.

However, in this case, the reactive power is also likely to increase, and it is not advantageous to extremely increase the effective sine wave peak voltage V0.

On the other hand, when power is to be applied to the ozonizer but it is not desirable to considerably increase the voltage at the ozonizer's electrodes because of reasons related to ozonizer's breakdown voltage etc., then the effective sine wave peak voltage V0 is decreased, to the left in FIG. 20.

In this case, the voltage at the electrodes of the ozonizer becomes lower and the discharge period becomes shorter, and then the electrostatic capacity in the non-discharging state becomes dominant, and the value of the jump rate M becomes larger due to the resonance with this electrostatic capacity. In this case, it is desirable to increase the power-supply frequency to get away from the resonance point. However, extremely increasing the frequency is not advantageous again.

Thus, when the characteristic of the resonance circuit is considered, causing the voltage to jump as much as possible is desirable because it allows reduction of the inverter voltage. However, when real driving operation is considered, it is appropriate to use voltages in the vicinities of the lowest points of the characteristic curves S71 and S72 of FIG. 20, more specifically, voltages higher or lower by 0% to 20% than the effective sine wave peak voltage V0 at the lowest points.

From the analysis above, the following two points should be noticed for the optimum conditions for driving the inverter, or for conditions for designing the resonance circuit.

(1) The value of the power-supply frequency of the inverter should be close to the resonant frequency of the resonance circuit (more specifically, frequencies that are higher by 5% to 10% than the resonant frequency).

(2) The power-supply voltage V0 should be selected such that the voltage jump rate M becomes the minimum on the characteristic curve of the voltage jump rate M with respect to the effective sine wave peak voltage V0 (or inverter's bus voltage Vd).

Satisfying these conditions makes it possible to efficiently cause a voltage jump while minimizing the reactive power.

The plasma-generation power-supply device 100 of FIG. 4 has shown a structure that uses the controller CT to control the power-supply frequency of the inverter IV and the duty. However, the controller CT is not needed when the resonant frequency corresponding to the ozonizer used has been obtained and there is no need to change the applied power. That is, in the plasma-generation power-supply device 90 shown in FIG. 1, the load voltage can be made to jump by the resonance when the power-supply frequency of the inverter IV is fixed at a value close to the resonant frequency of the resonance circuit.

In practice, the device may be used outside of the above-described conditions because of a demand to apply desired power to the load, for example. In reality, a practical range is from around half to two times the value at the lowest point of the jump rate M.

The ranges of the power-supply operation conditions are formulated on the basis of specific examples conforming to the structures of ozonizers.

<12-2. Realistic Range of Power-Supply Voltage V0 and Realistic Range of Jump Rate M>

The value of the lowest point of the jump rate M in FIG. 20 is expressed as a representative value M00 and the corresponding value of the effective sine wave peak value V0 is expressed as a representative value V00.

The representative value V00 and the corresponding minimum value M00 of the jump rate M are given by Expression (9) and Expression (10) below. These expressions are modified to approximate expressions.

[Expression 9]

$$V00 = \sqrt{2} V^* \left(1 + \frac{Ca}{Cg}\right) \left(1 - \sqrt{1 - \frac{1}{\left(1 + \frac{Ca}{Cg}\right)\left(1 + \frac{Cp}{Cg}\right)}}\right) \qquad (9)$$

$$\cong \frac{V^*}{\sqrt{2}\left(1 + \frac{Cp}{Cg}\right)}$$

[Expression 10]

$$M00 = \sqrt{2} \left( \frac{\left(\left(1 + \frac{Ca}{Cg}\right)\left(1 + \frac{Cp}{Cg}\right) - \frac{1}{2}\right) +}{\sqrt{\left(\left(1 + \frac{Ca}{Cg}\right)\left(1 + \frac{Cp}{Cg}\right) - \frac{1}{2}\right)^2 - \frac{1}{4}}} \right) \qquad (10)$$

$$\cong 2\sqrt{2} \left(\left(1 + \frac{Ca}{Cg}\right)\left(1 + \frac{Cp}{Cg}\right) - 0.5\right)$$

From the discussion above, it is known that the extent of voltage jump by the resonance circuit is determined by the electrostatic capacities of the load and the applied power.

Then, the representative values V00 and M00 are determined from the load's electrostatic capacities and Expressions (9) and (10). Next, the effective sine wave peak voltage V0 is adjusted to meet the target applied power. This means adjusting the design value of the inverter's bus voltage Vd or adjusting inverter's duty by PWM control.

When the effective sine wave peak voltage V0 is varied from the representative value V00, the load peak voltage Vp varies as shown by the curves S81 and S82 in FIG. 20, and the jump rate M also varies at the same time. That is, the representative value M00 of the jump rate M is determined by the structure, and the jump rate M becomes somewhat higher when the power is adjusted.

Accordingly, precisely obtaining the value of the jump rate M requires that the ozonizer's electrostatic capacity values and effective sine wave peak voltage V0 or power be clear.

However, as mentioned earlier, the reactive power becomes large when the effective sine wave peak voltage V0 is too large. When the effective sine wave peak voltage V0 is small, sufficient voltage cannot be applied to the ozonizer and then the frequency is made very high to obtain necessary power.

Accordingly, as mentioned earlier, a realistic range of the effective sine wave peak voltage V0 is around half to two times the representative value V00.

Figure 21:
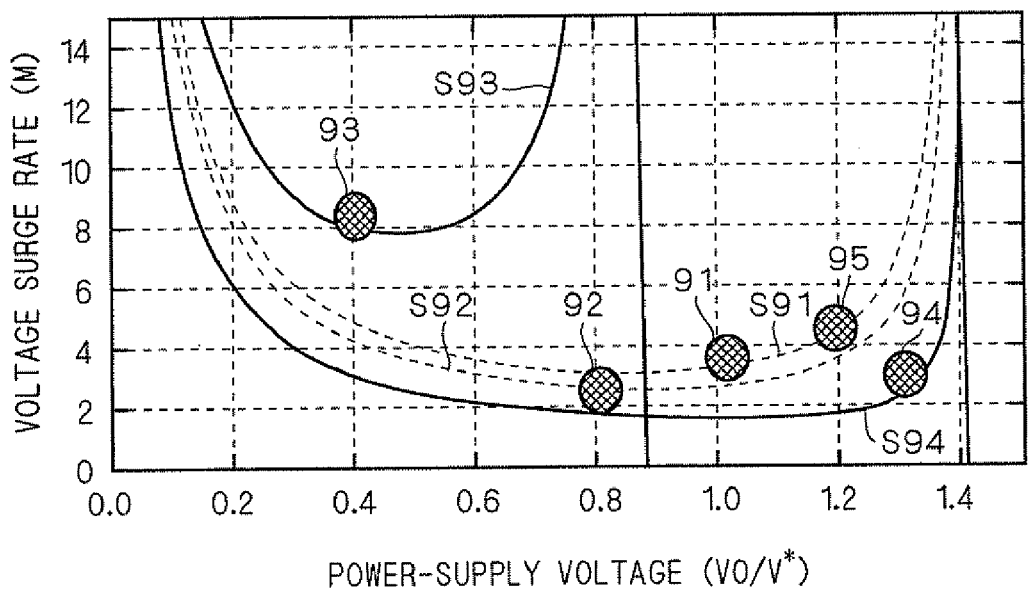
[FIG. 21] A diagram showing a relation between power-supply voltage and jump rate.

Now, FIG. 21 shows relations between the power-supply voltage (effective sine wave peak voltage) V0 and the jump rate M which were obtained when some real ozonizers were driven with the plasma-generation power-supply device 100 of the invention.

In FIG. 21, the horizontal axis shows the ratio between the discharge maintaining voltage V* and the effective sine wave peak voltage V0, and the vertical axis shows the jump rate M. The characteristic curves S91, S92, S93 and S94 show operational characteristics of five kinds of ozonizers. The characteristic curves S91 to S94 were obtained by driving commercially available ozonizers with the plasma-generation power-supply device 100 of the present invention.

In FIG. 21, the operating points of the ozonizers are shown as points 91 to 95. Some ozonizers are operated in the vicinity of the lowest point or the representative value M00 of the jump rate M, while others are operated somewhat on the right or left of it. The ozonizers having the operating points 91 to 95 are hereinafter referred to respectively as ozonizers 91 to 95.

The ozonizer 92, for example, uses a point that approximately coincides with the lowest point of the characteristic curve S92, but the ozonizer 91 uses higher power-supply voltage because it needs application of some more power than that of the lowest point of the characteristic curve S91. The ozonizer 95 uses still higher power-supply voltage because it needs still more power than the ozonizer 91.

With the ozonizer 94, the electrostatic capacity Cg of the dielectric is very large, and the capacitive component of the ozonizer load is weak and therefore the voltage is less likely to jump by resonance, and so M exhibits smaller values. On the other hand, the effective sine wave peak voltage V0 is increased to apply power, and so the jump rate M is considerably larger than the representative value M00.

The floating electrostatic capacities Cp of the ozonizers 91, 92, 94 and 95 are negligible for structural reasons, but the floating electrostatic capacity Cp of the ozonizer 93 is not negligible. Therefore, the lowest point of its jump rate M considerably differs from those of the other three.

Also, in the ozonizer 93, the electrostatic capacity Ca of the gas region is characteristically large. This, together with the effect of the floating electrostatic capacity Cp, results in very strong ozonizer-load capacitive component, and therefore the jump rate M is so large and exhibits a value around 8 at its lowest point. With the ozonizer 93, a jump rate on the left of the lowest point is used because the plasma-generation power-supply device 100 of the invention increases the frequency, without increasing the voltage, in order to apply power.

Figure 22:
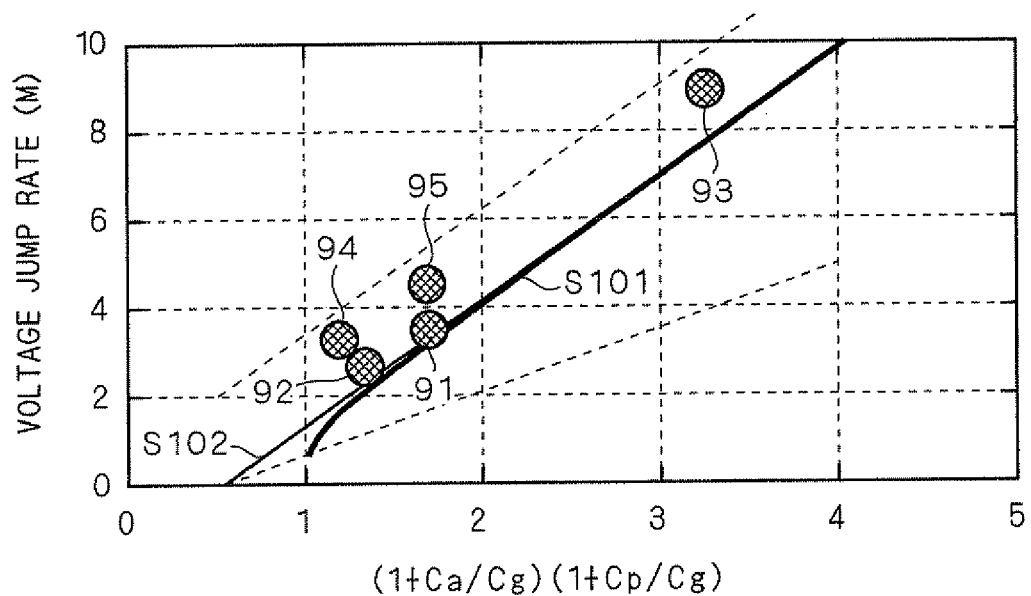
[FIG. 22] A diagram showing a relation between minimum values of the jump rate and electrostatic capacities.

FIG. 22 shows a graph of Expression (10).

In FIG. 22, the horizontal axis shows the functional part including the electrostatic capacities shown in Expression (10), and the vertical axis shows the jump rate M. The characteristic curve S101 shown by bold line represents the theoretical line of Expression (10), and the straight line S102 along it represents the approximate expression. Values on this straight line are the representative values M00. The practical values of the jump rate M of the five ozonizers 91 to 95 shown in FIG. 21 are shown as points 91 to 95, respectively.

All jump rates M are somewhat above the theoretical line of the representative value M00, and the point 94, for example, exhibits a considerably larger value.

From these examples, it is possible to estimate a realistic range of values of the effective sine wave peak voltage V0 and a realistic range of values of the jump rate M.

First, from FIG. 21, the realistic range of the effective sine wave peak voltage V0 is thought to be about half to two times the value of V00 shown by Expression (9).

Also, the realistic range of the jump rate M is determined as M00+2>M>M00/2 with respect to the representative value M00 determined by Expression (10).

The description above has shown examples that use the plasma-generation power-supply device 100 having the controller CT, because various kinds of ozonizers are used. However, needless to say, when the characteristics (resonant frequency and jump rate) of each ozonizer are known, a desired ozonizer can be efficiently operated with the plasma-generation power-supply device 90 of FIG. 1 on the basis of the minimum value M00 of the jump rate determined by Expression (10).

<12-3. Relation Between Power-Supply Voltage V0 and Inverter's Bus Voltage Vd>

Next, the relation between the power-supply voltage V0 and inverter's bus voltage Vd will be examined.

The discussion so far was based on the assumption that the waveform is a perfect sine wave and the circuit dissipation is zero. That is, the circuit resonance under ideal condition has been discussed. However, in reality, there are a lot of factors to be considered.

Specifically, they are the power factor of the inverter output, dissipation of the circuit (reactor etc.), and the like. Also, the discussion above has been made with examples in which the power-supply frequency perfectly agrees with the resonant frequency of the circuit. However, it is desirable to allow for a further voltage margin because points somewhat away from the resonance point are used in practice.

When the voltage reduction rate due to these factors is represented as $\eta$, inverter's bus voltage Vd is given by Expression (11) below.

[Expression 11]

$$V_d = \frac{V0}{\eta\sqrt{2d}} \qquad (11)$$

Wherein, for example, when d=0.25 and $\eta$=1, then $\eta\sqrt{d}$=0.5, and when d=0.8 and $\eta$=0.56, then $\eta\sqrt{d}$=0.5, and therefore $\eta\sqrt{d}$ will be around 0.5 at least.

That is, it can be regarded as $1>\eta\sqrt{d}>0.5$.

From the discussion above, M00+2>M>M00/2, and so the range of the ratio Md (Vp/Vd) between ozonizer's inter-electrode voltage Vp and inverter's bus voltage Vd is given by Expression (12) below, so as to specify a realistic range.

[Expression 12]

$$\sqrt{2}(M00+2) > M_d > \frac{\sqrt{2}}{4}M00 \qquad (12)$$

Also, the range of the power-supply voltage V0 is from half to two times the representative value V00 given by Expression (9), and Expression (11) is applied to this relation and the range of inverter's bus voltage Vd is given by Expression (13) below.

[Expression 13]

$$\frac{4}{\sqrt{2}}V00 > V_d > \frac{1}{2\sqrt{2}}V00 \qquad (13)$$

The expression above can be modified to Expression (14) below, and the range of inverter's bus voltage Vd is specified on the basis of electrostatic capacities.

[Expression 14]

$$\frac{4V^*}{1+\frac{Cp}{Cg}} > V_d > \frac{V^*}{2\left(1+\frac{Cp}{Cg}\right)} \qquad (14)$$

The ranges defined by Expressions (12) and (14) are fairly wide when realistic applications to ozonizers are considered.

Accordingly, operational conditions of the ozonizers 91 to 95 shown in FIGS. 21 and 22 are listed in Table 1 below, and more realistic ranges of inverter's bus voltage Vd and ozonizer's inter-electrode voltage Vp are defined on the basis of the information.

TABLE 1

| | Ozonizer No. | | | | |
|---|---|---|---|---|---|
| | 91 | 92 | 93 | 94 | 95 |
| ca/cg | 0.7 | 0.49 | 1 | 0.17 | 0.67 |
| cp/cg | 0 | 0 | 0.63 | 0 | 0 |
| Discharge maintain voltage V* | 2390 | 4280 | 1600 | 2460 | 2115 |
| Discharge power density W/S | 0.25 | 0.25 | 2.5 | 0.64 | 0.2 |
| Ozonizer voltage (peak value) Vp[V] | 8000 | 11000 | 5375 | 8407 | 10000 |
| Inverter bus voltage Vd[V] | 2180 | 3840 | 634 | 2970 | 2258 |
| Md = Vp/Vd | 3.7 | 2.87 | 8.47 | 2.83 | 4.4 |

Table 1 above shows the results obtained by driving commercially available ozonizers with the plasma-generation power-supply device 100 of the invention.

In Table 1, the discharge power density (W/S) indicates the discharge power applied per unit electrode area (/cm$^2$), which value depends also on the device structure.

The ozonizers 91, 92, 94 and 95 shown in Table 1 are all cylindrical multi-tube type ozonizers as described with FIG. 10, where the floating electrostatic capacity Cp, which is parallel to the load, is so small and negligible, and the values of Cp/Cg are shown as zero in Table 1. However, the ozonizer 93 has a peculiar structure and Cp/Cg=0.63.

Now, when ozonizers of a type like the ozonizer 93 are regarded as exceptions and only the ozonizers whose floating electrostatic capacity Cp can be handled as zero are taken into consideration, then the Expression (14) can be further simplified to exclude the electrostatic capacities as 4V*>Vd>0.5V*.

On the basis of the information of Table 1, a more realistic range can be specified as 2V*>Vd>0.5V*.

Also, on the basis of Table 1, the range of the ratio Md, between ozonizer's inter-electrode voltage Vp and inverter's bus voltage Vd, can be specified as a more realistic range as 6>Md>1.

Also, as can be seen from Table 1, the values of the discharge maintaining voltage V* are from 2 kV to 4 kV, in which case the breakdown voltage of elements has to be 1 kV or more. Furthermore, considering the use of ozonizers, current flowing therein is not small. Accordingly, desired switching elements to form the inverter are large-capacity semiconductor elements such as Insulated-Gate Bipolar Transistors (IGBTs).

The description above has shown examples that use the plasma-generation power-supply device 100 having the controller CT because the examples use various types of ozonizers, but, needless to say, the range of inverter's bus voltage Vd shown by Expression (14) is applicable also to the plasma-generation power-supply device 90 described with FIG. 1.

<13. Examples of Configuration of Inverter>

As mentioned above, a high-voltage inverter for driving an ozonizer requires switching elements having high breakdown voltage and therefore uses high-voltage IGBTs. Also, recent ozonizers are driven at increased frequencies of 1 KHz to 20 kHz.

Some specific examples of the configuration of the high-voltage inverter for driving ozonizers will be described below.

<13-1. Inverter Having Two Stages of Inverter Blocks>

For example, a high-voltage inverter with an output voltage of 2 kV can be constructed with one inverter block including full-bridge-connected IGBT elements having a breakdown voltage of 2 kV, with a bus voltage of 2 kV. However, a structure having two stages of inverter blocks, as shown in FIG. 23, can be adopted to allow the use of IGBT elements having a breakdown voltage lower than the bus voltage.

Figure 23:
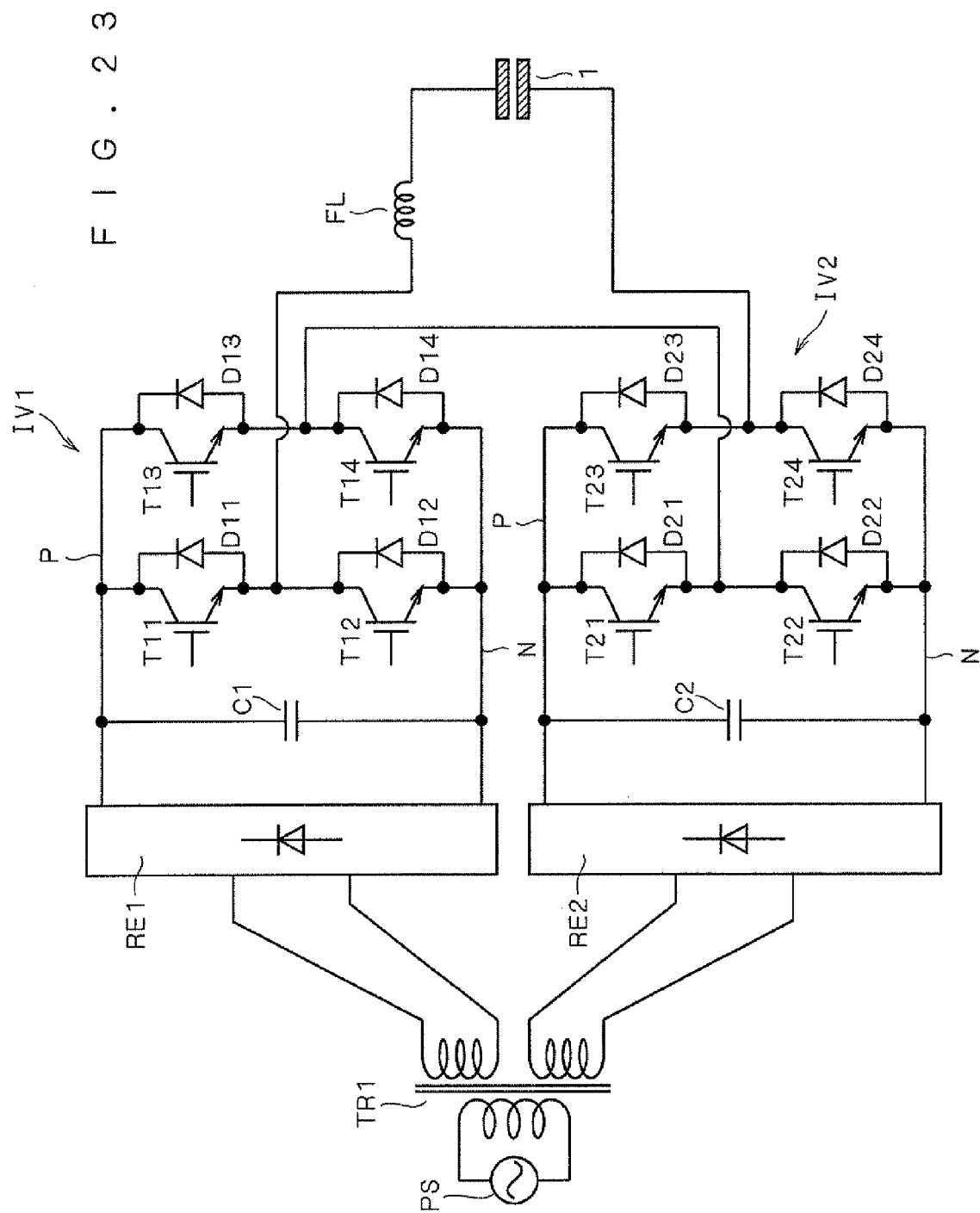
[FIG. 23] A diagram illustrating the configuration of an inverter having two stages of inverter blocks.

The inverter shown in FIG. 23 has inverter blocks IV1 and IV2 formed of IGBT elements having a breakdown voltage that is half the output voltage, and the inverter blocks IV1 and TV2 are connected in series with the two electrodes of the ozonizer 1.

Rectifiers RE1 and RE2 are provided to supply an alternating voltage respectively to the inverter blocks IV1 and IV2, and the rectifiers RE1 and RE2 are supplied with a high alternating voltage from the alternating-current power-supply PS through a transformer TR1. The transformer TR1 is an insulated transformer in which the primary and secondary sides are electrically insulated, and the secondary side has two windings so that one transformer can supply a high alternating voltage to the two rectifiers RE1 and RE2, so as to simultaneously supply power to the series-connected two inverter blocks IV1 and IV2.

Smoothing capacitors C1 and C2 are interposed respectively between the main power-supply lines (bus lines) P and N that supply the alternating voltage from the rectifiers RE1 and RE2 to the inverter blocks IV1 and IV2.

Each of the inverter blocks IV1 and IV2 includes two sets of inverter-connected insulated-gate bipolar transistors provided between the main power-supply lines P and N to form a fill bridge connection of IGBTs.

That is, the inverter block IV1 includes inverter-connected transistors T11 and T12 and transistors T13 and T14 provided between the P and N lines, and the inverter block IV2 includes inverter-connected transistors T21 and T22 and transistors T23 and T24 provided between the P and N lines. The output node of the set of transistors T11 and T12 is connected to one end of the reactor FL, and the other end of the reactor FL is connected to one electrode of the ozonizer 1. The output node of the set of transistors T23 and T24 is connected to the other electrode of the ozonizer 1. This electrode is grounded in use.

The output node of the set of transistors T13 and T14 is connected to the output node of the set of transistors T21 and T22.

Diodes D11, D12, D13 and D14 are connected in reverse-parallel respectively with the transistors T11, T12, T13 and T14, and diodes D21, D22, D23 and D24 are connected in reverse-parallel respectively with the transistors T21, T22, T23 and T24. These diodes are for freewheeling of current.

When the configuration shown in FIG. 23 is adopted and the voltage difference between the PN lines of the inverter blocks IV1 and IV2 is 1 kV at most, for example, the inverter's output voltage is 2 kV but a breakdown voltage of 1 kV is sufficient for the transistors.

That is, as mentioned above, the electrode of the ozonizer 1 to which the output node of the set of transistors T23 and T24 is connected is at ground potential. Then, when the potential of the main power-supply line N of the inverter block IV2 is 0 V, the potential of the main power-supply line P is 1 kV, and the voltage of the output node of the set of transistors T21 and T22 is 1 kV.

When the voltage of the output node of the set of transistors T21 and T22 is 1 kV, the potential of the main power-supply line N of the inverter block IV1 is 1 kV, and the potential of the main power-supply line P is 2 kV, and the voltage of the output node of the set of transistors T11 and T12 is 2 kV.

In this way, the voltage difference between the P and N lines is 1 kV at most, and therefore the breakdown voltage of the transistors can also be 1 kV, i.e., the breakdown voltage can be half the output voltage of the inverter.

Thus, the inverter can be constructed with transistors having a breakdown voltage lower than the output voltage, by connecting a plurality of inverter blocks in series with the two electrodes of the ozonizer.

Needless to say, the output current of the inverter can be made larger by connecting a plurality of inverter blocks in parallel with the two electrodes of the ozonizer.

<13-2. Inverter Having Four Stages of Inverter Blocks>

Figure 24:
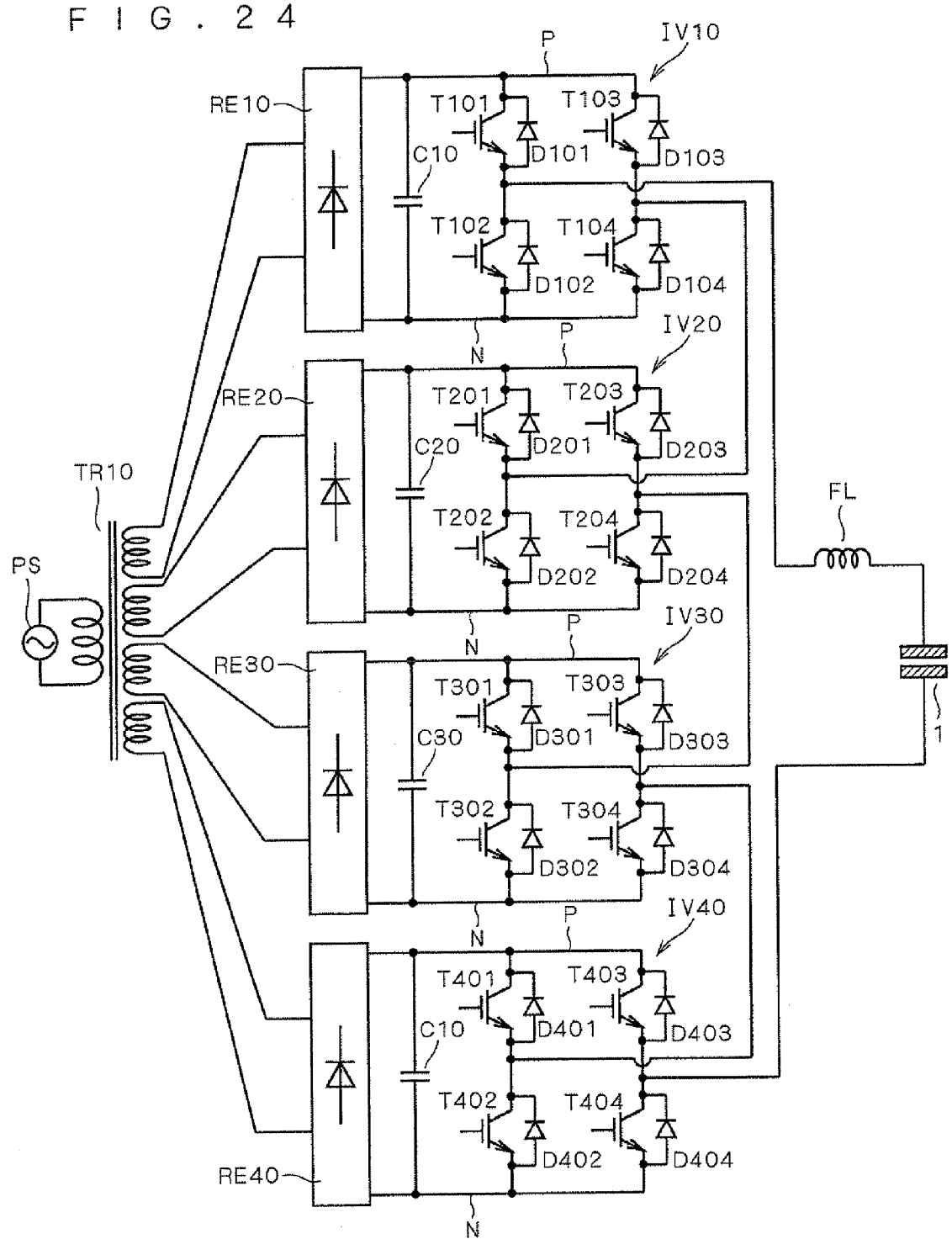
[FIG. 24] A diagram illustrating the configuration of an inverter having four stages of inverter blocks.

When the voltage for driving the ozonizer is extremely high and using high-voltage IGBTs accordingly costs much, the costs can be reduced by using a larger number of inverter blocks formed of IGBTs having breakdown voltage reasonable for the costs. FIG. 24 shows an example of such an inverter, having four stages of inverter blocks.

The inverter shown in FIG. 24 includes inverter blocks IV10, IV20, IV30 and IV40 formed of IGBT elements having a breakdown voltage that is one-fourth the output voltage, and the inverter blocks IV10 to IV40 are connected in series with the two electrodes of the ozonizer 1.

Rectifiers RE10, RE20, RE30 and RE40 are provided to supply an alternating voltage respectively to the inverter blocks IV10, IV20, IV30 and IV40, and the rectifiers RE10 to RE40 are supplied with a high alternating voltage from the alternating-current power-supply PS through a transformer TR10. The transformer TR10 is an insulated transformer in which the primary and secondary sides are electrically insulated, and the secondary side has four windings so that one transformer can supply a high alternating voltage to the four rectifiers RE10 to RE40, so as to simultaneously supply power to the series-connected four inverter blocks IV10 to IV40.

Smoothing capacitors C10, C20, C30 and C40 are interposed respectively between the main power-supply lines (buses) P and N that supply the alternating voltage from the rectifiers RE10 to RE40 to the inverter blocks IV10 to IV40.

Each of the inverter blocks IV10 to IV40 has two sets of inverter-connected insulated-gate bipolar transistors provided between the main power-supply lines P and N to form a full-bridge connection of IGBTs.

That is, the inverter block IV10 includes inverter-connected transistors T101 and T102 and transistors T103 and T104 provided between the P and N lines, the inverter block IV20 includes inverter-connected transistors T201 and T202 and transistors T203 and T204 provided between the P and N lines, the inverter block IV30 includes inverter-connected transistors T301 and T302 and transistors T303 and T304 provided between the P and N lines, and the inverter block IV40 includes inverter-connected transistors T401 and T402 and transistors T403 and T404 provided between the P and N lines.

The output node of the set of transistors T101 and T102 is connected to one end of the reactor FL, and the other end of the reactor FL is connected to one electrode of the ozonizer 1. The output node of the set of transistors T403 and T404 is connected to the other electrode of the ozonizer 1. This electrode is grounded in use.

The output node of the set of transistors T103 and T104 is connected to the output node of the set of transistors T201 and T202, the output node of the set of transistors T203 and 1204 is connected to the output node of the set of transistors T301 and T302, and the output node of the set of transistors T303 and T304 is connected to the output node of the set of transistors T401 and T402.

Diodes D101, D102, D103 and D104 are connected in reverse-parallel respectively with the transistors T101, T102, T103 and T104, diodes D201, D202, D203 and D204 are connected in reverse-parallel respectively with the transistors T201, T202, T203 and T204, diodes D301, D302, D303 and D304 are connected in reverse-parallel respectively with the transistors T301, T302, T303 and T304, and diodes D401, D402, D403 and D404 are connected in reverse-parallel respectively with the transistors T401, T402, T403 and T404. These diodes are for freewheeling of current.

When the configuration shown in FIG. 24 is adopted and the voltage difference between the P and N lines of each of the inverter blocks IV10 to IV40 is 1 kV at most, for example, the inverter's output voltage is 4 kV but a breakdown voltage of 1 kV is sufficient for the transistors.

When the configuration shown in FIG. 24 is adopted, the four inverter blocks IV10 to IV40 are turned on/off not simultaneously but stepwise, and then the output voltage varies stepwise as shown in FIG. 25 to output a rectangular waveform closer to a sine wave.

That is, in FIG. 25, the step ST1 that is one level higher than the 0 V line is obtained by turning on only the inverter block IV10 with the other inverter blocks being off.

In this process, in the inverter block IV10, for example, turning on the inverter block means turning on the transistors T101 and T104 and turning off the transistors T102 and T103.

Also, in the inverter block IV10, for example, turning off the inverter block means turning off the transistors T101 and T103 and turning on the transistors T102 and T104.

Referring to FIG. 25 again, the step ST2 that is two levels higher than the 0 V line is obtained by turning on the inverter blocks IV10 and IV20 and turning off the other inverter blocks.

Also in FIG. 25, the step ST3 that is three levels higher than the 0 V line is obtained by turning on the inverter blocks IV10, IV20 and IV30 and turning off the inverter block IV40.

Also in FIG. 25, the step ST4 that is four levels higher than the 0 V line is obtained by turning on all the inverter blocks IV10 to IV40.

In FIG. 25, the steps below the 0 V line are obtained by turning on/off the inverter blocks with their P-N lines set at minus potential, in which case the definition of turning on/off the inverter blocks differs.

That is, in the inverter block A10, for example, turning on the inverter block means turning off the transistors T101 and T104 and turning on the transistors T102 and T103.

Also, in the inverter block IV10, for example, turning off the inverter block means turning on the transistors T101 and T103 and turning off the transistors T102 and T104.

The description assumes that the voltage differences between the P-N lines of the four inverter blocks IV10 to IV40 are equal, but the voltage differences may be set different.

<13-3. Power Dissipations in Semiconductor Elements>

When the inverter configuration as shown in FIG. 24 is adopted, the transformer TR10 is large-sized and switching is done for a very large number of times, which will result in large power dissipations in the semiconductor elements.

When IGBT elements are driven at high frequencies, a serious problem to be dealt with is their switching dissipations rather than ON-state dissipations.

Dissipations caused in switching include three kinds, i.e., a switching dissipation in turning on (Eon), a switching dissipation in turning off (Eoff), and a recovery dissipation (Erec) of the freewheeling diode element provided in parallel with the IGBT element.

Now, for the sake of simplicity, it is assumed that an inverter as shown in FIG. 26 outputs a rectangular wave and a current close to a sine wave flows as a result of the resonance of the circuit.

The inverter shown in FIG. 26 includes inverter-connected transistors T1 and T2 and transistors T3 and T4, and a smoothing capacitor CO inserted between the P-N lines, where the output node of the set of transistors T1 and T2 is connected to one end of the reactor FL and the other end of the reactor FL is connected to one electrode of the ozonizer 1. The output node of the set of transistors T3 and T4 is connected to the other electrode of the ozonizer 1. This electrode is grounded in use.

Figure 27:
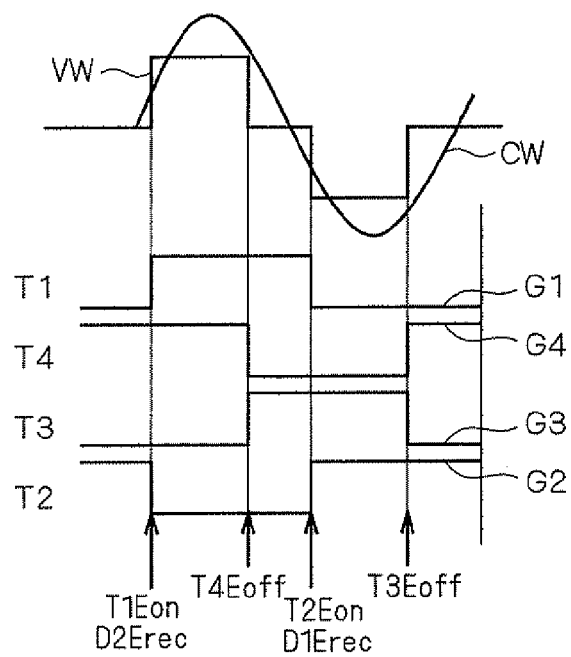
[FIG. 27] A timing chart illustrating an example of a method for controlling the inverter.

FIG. 27 shows a rectangular voltage waveform VW outputted from the inverter of FIG. 26, its sinusoidal current waveform CW, and timing of turning on/off of the IGBT elements (gate waveforms). That is, the gate waveforms given to the transistors T1, T2, T3 and T4 are respectively shown as G1, G2, G3 and G4, and FIG. 27 also shows which kinds of dissipations occur at which elements when switched.

That is, when the transistor T2 turns off and the transistor T1 turns on, a switching dissipation (Eon) occurs due to the tun-on of the transistor T1 and a recovery dissipation (Erec) occurs at the diode D2 due to the turn-off of the transistor T2.

When the transistor T4 turns off and the transistor T3 turns on, a switching dissipation (Eoff) occurs due to the turn-off of the transistor T4.

Also, when the transistor T1 turns off and the transistor T2 turns on, a switching dissipation (Eon) occurs due to the turn-on of the transistor T2 and a recovery dissipation (Erec) occurs at the diode D1 due to the turn-off of the transistor T1.

When the transistor T3 turns off and the transistor T4 turns on, a switching dissipation (Eoff) occurs due to the turn-off of the transistor T3.

As shown in FIG. 27, the power dissipations do not occur equally in the transistors T1 to T4 and the diodes D1 to D4, but the transistors T3 and T4 suffer turn-off switching dissipations (Eoff), and the transistors T1 and T2 suffer turn-on switching dissipations (Eon), and the diodes D1 and D2 suffer recovery dissipations.

Accordingly, when a transistor and a diode form a single semiconductor chip, the semiconductor chip formed of the set of transistor T1 and diode D1 and the semiconductor chip formed of the set of transistor T2 and diode D2 suffer larger power dissipations than the other semiconductor chips and will be overheated due to the power dissipations.

Also, depending on the current values flowing in the elements, the semiconductor chip formed of the set of transistor T3 and diode D3 and the semiconductor chip formed of the set of transistor T4 and diode D4 may suffer larger power dissipations, and then they will be overheated.

This problem can be avoided by changing the pattern of control of the semiconductor elements at certain intervals so that the power dissipations will not concentrate in particular semiconductor chips. This control method will be specifically described below.

<13-4. Control Method that Averages Power Dissipations of Semiconductor Elements>

<13-4-1. First Example of the Control Method>

Figure 28:
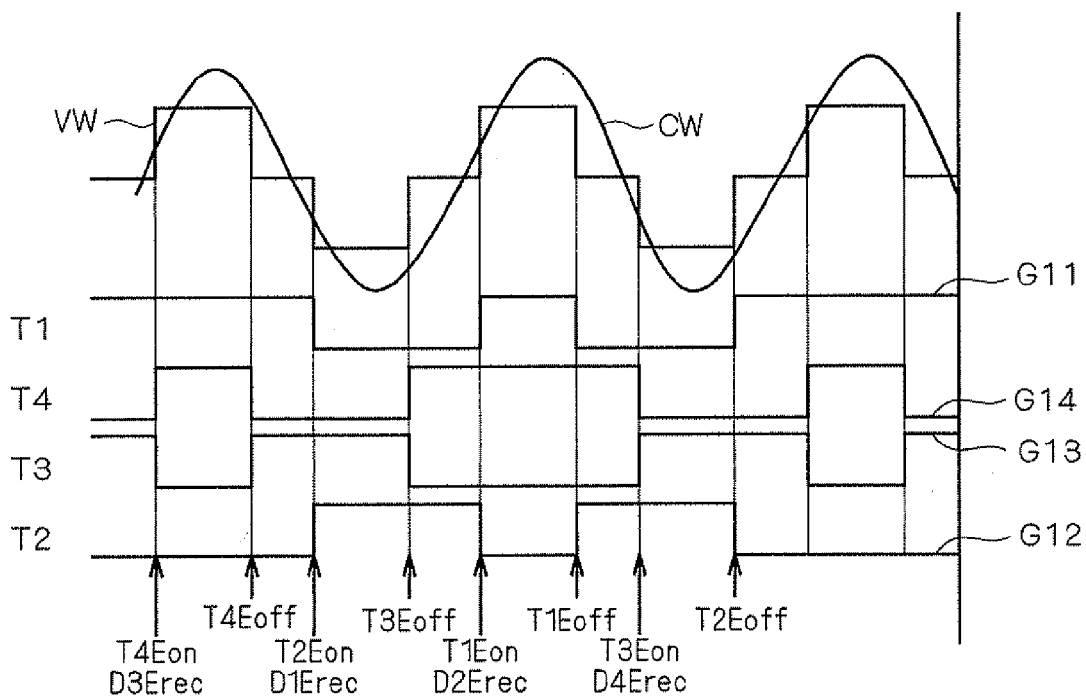
[FIG. 28] A timing chart illustrating a method of controlling the inverter, where the power dissipations in the semiconductor elements are averaged.

FIG. 28 shows gate waveforms that are generated on the basis of the idea above and given respectively to the IGBT elements, and a rectangular voltage waveform VW and a sinusoidal current waveform CW that the inverter of FIG. 26 outputs when controlled on the basis of the gate waveforms. FIG. 28 also shows which kinds of dissipations occur in which elements when switched.

In the gate waveforms shown in FIG. 28, as compared with the gate waveforms G1 to G4 shown in FIG. 27, the gate waveforms G1 and G4 and the gate waveforms G2 and G3 are replaced by each other for each cycle.

That is, the gate waveform G11 is based on the gate waveform G1 and configured so that the gate waveform G4 and the gate waveform G1 replace each other for each cycle, and the gate waveform G14 is based on the gate waveform G4 and configured so that the gate waveform G1 and the gate waveform G4 replace each other for each cycle.

The gate waveform G13 is based on the gate waveform G3 and configured so that the gate waveform G4 and the gate waveform G3 replace each other for each cycle, and the gate waveform G12 is based on the gate waveform G2 and configured so that the gate waveform G3 and the gate waveform G2 replace each other for each cycle.

With the gate waveforms G11 to G14 shown in FIG. 28, when the transistor T3 turns off and the transistor T4 turns on, a switching dissipation (Eon) occurs due to the turn-on of the transistor T4 and a recovery dissipation (Erec) occurs at the diode D3 due to the turn-off of the transistor T3.

Also, when the transistor T4 turns off and the transistor T3 turns on, a switching dissipation (Eoff) occurs due to the turn-off of the transistor T4.

When the transistor T1 turns off and the transistor T2 turns on, a switching dissipation (Eon) occurs due to the turn-on of the transistor T2 and a recovery dissipation (Erec) occurs at the diode D1 due to the turn-off of the transistor T1.

When the transistor T3 turns off and the transistor T4 turns on, a switching dissipation (Eoff) occurs due to the turn-off of the transistor T3.

When the transistor T2 turns off and the transistor T1 turns on, a switching dissipation (Eon) occurs due to the turn-on of the transistor T1 and a recovery dissipation (Erec) occurs at the diode D2 due to the tun-off of the transistor T2.

When the transistor T1 turns off and the transistor T2 turns on, a switching dissipation (Eoff) occurs due to the turn-off of the transistor T1.

When the transistor T4 turns off and the transistor T3 turns on, a switching dissipation (Eon) occurs due to the turn-on of the transistor T3 and a recovery dissipation (Erec) occurs at the diode D4 due to the turn-off of the transistor T4.

When the transistor T2 turns off and the transistor T1 turns on, a switching dissipation (Eoff) occurs due to the turn-off of the transistor T2.

In this way, with the four IGBT elements forming two inverter connections, the gate waveforms given to the high-potential IGBT element of one inverter connection and the low-potential IGBT element of the other inverter connection are replaced by each other for each cycle, which prevents occurrence of nonuniform power dissipations in the transistors T1 to T4 and diodes D1 to D4, and thus averages the power dissipations, averages heat generation in the elements, and reduces the amount of maximum heat generation in each element.

<13-4-2. Second Example of the Control Method>

Figure 29:
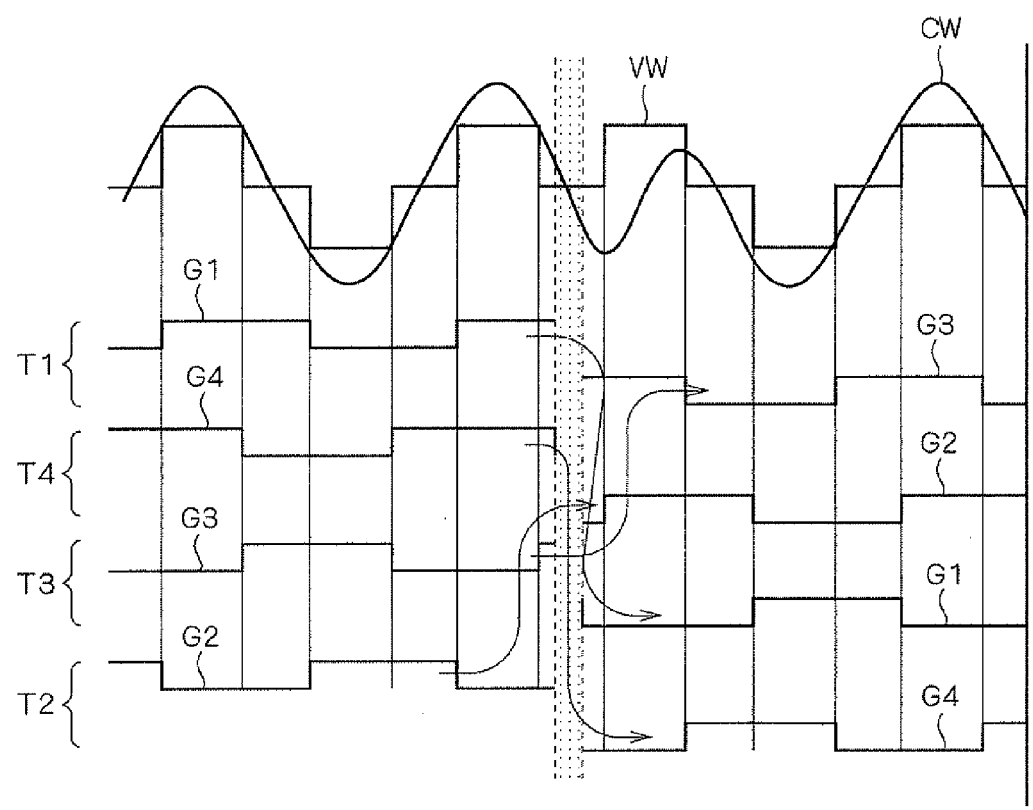
[FIG. 29] A timing chart illustrating a method of controlling the inverter, where the power dissipations in the semiconductor elements are averaged.

As for another method of controlling the inverter to solve nonuniform power dissipations, the gate waveforms given to the IGBT elements may be changed forcedly as shown in FIG. 29.

That is, with the basic gate waveforms G1 to G4 shown in FIG. 27, the gate waveforms are forcedly exchanged at a time when the voltage waveform VW outputs no pulse (in FIG. 29, this timing is shown with a hatched area), i.e., when the transistors T1 and T3 are on, or when the transistors T2 and T4 are on, the gate waveforms are forcedly exchanged such that the gate waveform G3 is given to the transistor T1, the gate waveform G1 is given to the transistor T3, the gate waveform G2 is given to the transistor T4, and the gate waveform G4 is given to the transistor T2. When the gate waveforms are forcedly exchanged next time, they are exchanged in the reverse manner.

When this method is adopted, as shown in FIG. 29, the voltage waveform VW exhibits two consecutive positive pulses. This makes the shape of the current waveform somewhat irregular. However, the shape of the current waveform is not very frequently made irregular, and therefore it does not considerably affect the operation of the inverter, because the cycle of exchanging the waveforms can be set sufficiently longer, e.g., one second, as compared with the frequency of the inverter, since it works satisfactorily as long as this cycle is sufficiently shorter than the length of time it takes the elements to be overheated by nonuniform power dissipations (a time period defined by the rate of heat conduction).

The gate waveforms can be forcedly exchanged by providing a structure that exchanges the gate waveforms G1 and G3, or the gate waveforms G2 and G4, e.g., a flip-flop circuit, preceding the gate signal input of each transistor.

<13-4-3. Third Example of the Control Method>

Figure 30:
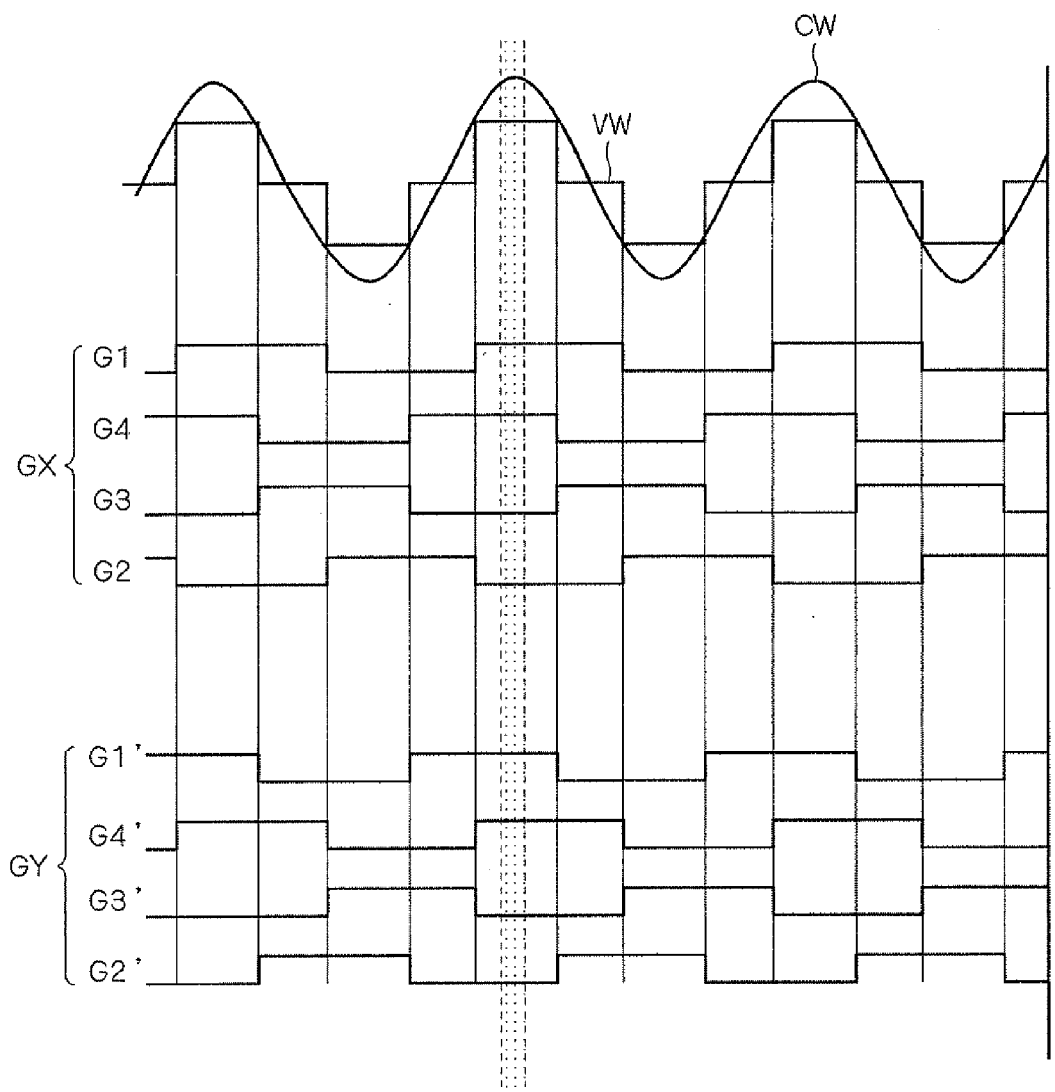
[FIG. 30] A timing chart illustrating a method of controlling the inverter, where the power dissipations in the semiconductor elements are averaged.

As to another method of forcedly exchanging the gate waveforms given to the IGBT elements, as shown in FIG. 30, two kinds of signal sources may be prepared so that the waveforms can be exchanged forcedly at a time when the voltage waveform VW is outputting a pulse.

That is, as shown in FIG. 30, two signal sources are prepared, including a signal source GX that outputs the basic gate waveforms G1 to G4 shown in FIG. 27, and a signal source GY that outputs gate waveforms G1' and G4' in which the gate waveforms G1 and G4 are exchanged with each other, and gate waveforms G2' and G3' in which the gate waveforms G2 and G3 are exchanged with each other.

Then, the gate waveforms are forcedly exchanged at a time when the voltage waveform VW outputs a pulse (in FIG. 30, this timing is shown with a hatched area), i.e., when the transistors T1 and T4 are on, or when the transistors T2 and T3 are on, the gate waveforms are changed such that the gate waveform G1' is given to the transistor T1, the gate waveform G2' is given to the transistor T2, the gate waveform G3' is given to the transistor T3, and the gate waveform G4' is given to the transistor T4. When the gate waveforms are forcedly exchanged next time, they are exchanged in the reverse manner.

This method requires two signal sources, but the inverter output waveform is not changed. The cycle of exchanging is appropriately set around one second.

<13-5. Measures to Solve Heat Generation Caused by Increased Power Dissipations>

Next, measures to be taken against further increased power dissipations in the elements will be described. As described earlier, when IGBT elements are driven at high frequencies, a serious problem is not the ON-state dissipations but the switching dissipations. Usually, when measures have to be taken to solve heat generation caused by large current and large power dissipations in semiconductor elements, a plurality of semiconductor elements are connected in parallel to distribute power dissipations.

The power dissipations of semiconductor elements are usually determined by the current flowing in the on state, and therefore a plurality of semiconductor elements connected in parallel are all turned on or made conductive so as to reduce the current flow in each element.

However, as mentioned earlier, in the inverter used in the plasma-generation power-supply device of the invention, not the ON-state dissipations but the switching dissipations are dominant. In this case, instead of reducing the current in on state, the number of turn-on operations of each semiconductor element is reduced.

Figure 31:
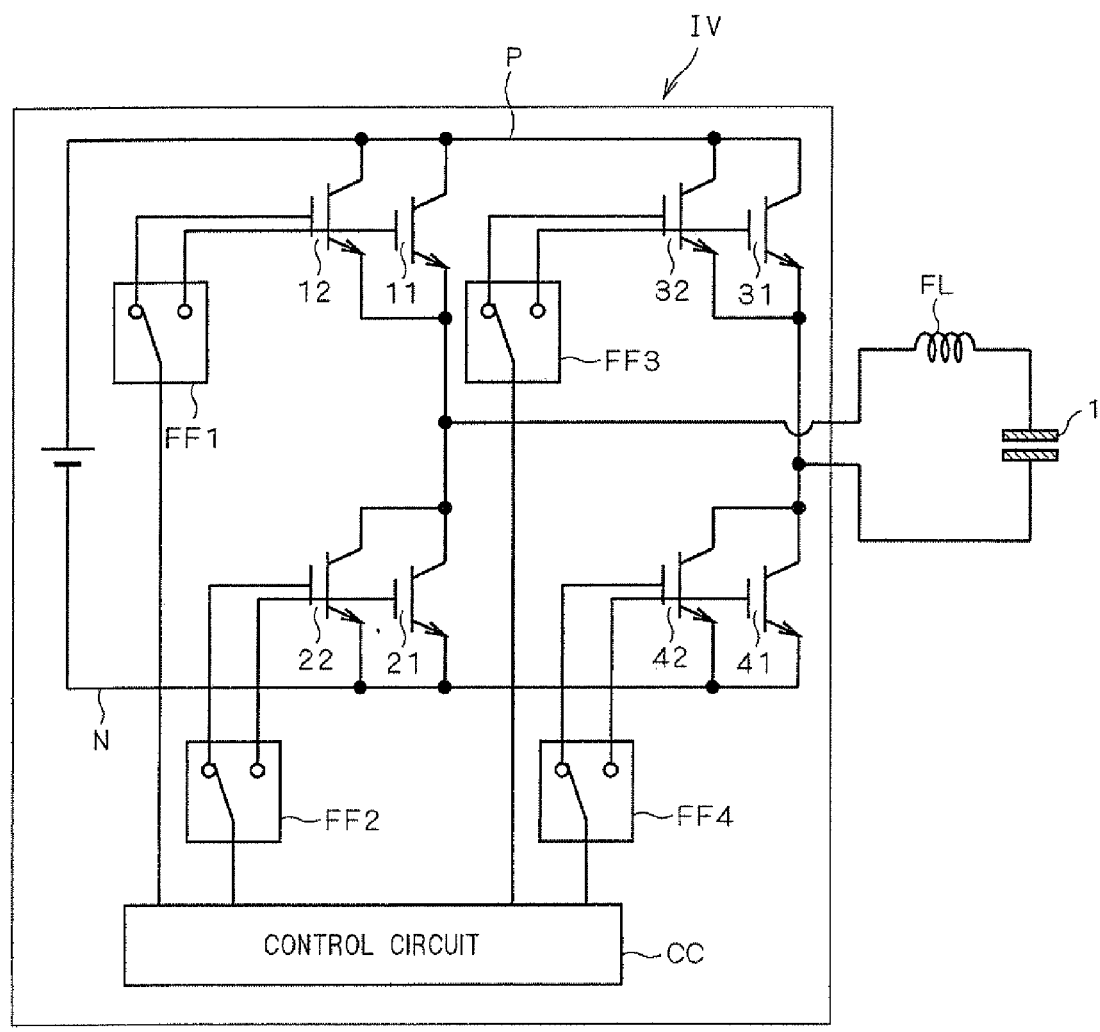
[FIG. 31] A diagram showing an example of the configuration of an inverter.

FIG. 31 shows an example of the configuration of an inverter IV used in the plasma-generation power-supply device 100, where two IGBTs are connected in parallel.

As shown in FIG. 31, inverter-connected IGBTs 11 and 21 and IGBTs 31 and 41 are provided between the main power-supply lines (bus) P and N, and the output nodes of these sets of IGBTs are connected respectively to the reactor FL and an electrode of the ozonizer 1.

Also, IGBTs 12, 22, 32 and 42 are connected in parallel respectively with the IGBTs 11, 21, 31 and 41.

The gate electrodes of the IGBTs 11 and 12, the IGBTs 21 and 22, the IGBTs 31 and 32, and the IGBTs 41 and 42 receive a control signal from a control circuit CC respectively through flip-flop circuits FF1, FF2, FF3 and FF4.

Figure 32:
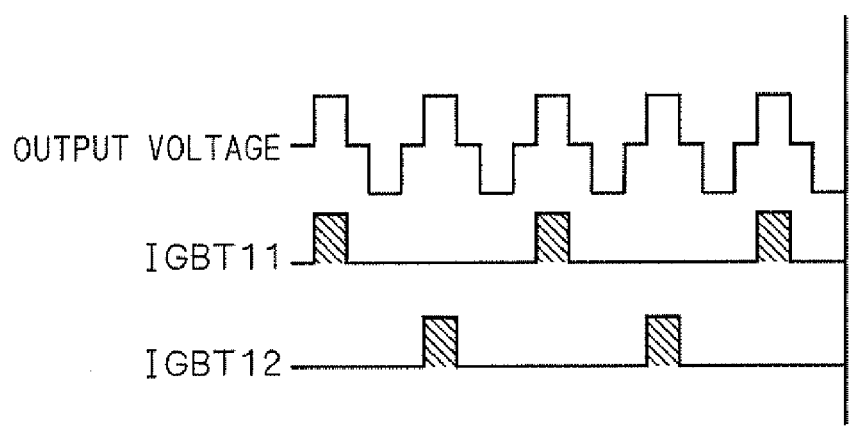
[FIG. 32] A timing chart illustrating a method of controlling the switching elements of the inverter.

For example, the flip-flop circuit FF1 is a structure that alternately turns on the IGBTs 11 and 12, and FIG. 32 shows an example of its timing chart.

As shown in FIG. 32, the IGBTs 11 and 12 are switched alternately such that the IGBT 11 turns on in the first period, the IGBT 12 turns on in the next period, and so on. The other sets of IGBTs are controlled in the same way, so that the switching frequency of each semiconductor element can be halved to halve the switching dissipation.

When semiconductor elements parallel-connected in this way are turned on not alternately but simultaneously each time, it is necessary to consider how to divide current. If the dividing of current fails and excessive current flows to one element, then the semiconductor element may be damaged. However, alternately turning on semiconductor elements as shown in FIG. 32 avoids the problem of dividing current.

<14. Applications to Apparatuses other than Ozonizers>

The present invention has been described chiefly about applications to ozonizers. Recent ozonizers of a most common type use air or oxygen as material, have gap intervals of 0.6 mm or less, and operate at atmospheric or higher gas pressures. Such ozonizers are suitable discharging loads for the present invention because they require high applied voltage, discharge maintaining voltages of kV-class, frequencies of kHz-class or higher, and serve as capacitive loads.

However, as mentioned at the beginning, the present invention is applicable to any capacitive discharging loads, such as a device called a flat-plate light source which includes two glass plates and a discharge gas such as xenon filling the gap between the glass plates, and in which an alternating voltage is applied from both sides of the discharge gap and light emitted from fluorescent material applied inside is taken out in a plane. The present invention is applicable also to PDPs (Plasma Display Panels) using the dielectric barrier discharge, laser oscillators, and so on.

While the invention has been described in detail, the foregoing description is in all aspects illustrative and not restrictive. It is understood that numerous other modifications and variations can be devised without departing from the scope of the invention.

The invention claimed is:

1. A plasma-generation power-supply device that drives a discharging load that generates a plasma, comprising:
   an alternating-current power-supply that supplies power to said discharging load; and
   a controller that is capable of controlling a frequency of an alternating output of said alternating-current power-supply,
   wherein said controller provides control to vary the power-supply frequency of said alternating-current power-supply in accordance with a target applied power to said discharging load, and
   said alternating-current power-supply is formed of an inverter, and said alternating output is a pulse output, and wherein when
   Cg: an electrostatic capacity value of a dielectric included in said discharging load,
   Ca: an electrostatic capacity value of a gas region included in said discharging load,
   Cp: a floating electrostatic capacity value in parallel with said discharging load,
   V*: a discharge maintaining voltage,
   L: an inductance value in a circuit including said discharging load,
   f: said power-supply frequency, and
   Cβ: an electrostatic capacity in a non-discharging state,
   then, said controller varies said power-supply frequency and a duty of said pulse output within a stable control region that is surrounded by:
   a characteristic curve of applied power that is obtained when said power-supply frequency is varied with said duty of said pulse output fixed at a maximum value;
   a curve representing 0.9 times a curve of an applied power Poz that is given by an expression below $$Poz = 4Cg(V^*)^2 f\left(\frac{Cg}{Cg + Cp - \frac{1}{L(2\pi f)^2}} - \left(1 + \frac{Ca}{Cg}\right)\right);$$

and,
   a straight line representing a resonant frequency $f_{max}$ in the non-discharging state that is given by an expression for $f_{max}$ below $$f_{max} = \frac{1}{2\pi\sqrt{LC_\beta}}.$$

2. The plasma-generation power-supply device according to claim 1, wherein said controller varies said power-supply frequency and said duty along a curve that is defined by:
- a segment, located on a higher-frequency side of a resonance point, of a characteristic curve of the applied power that is obtained when the frequency is varied with the duty of said pulse output fixed at a value from 80% to 90% of the maximum value; and
- a straight line that represents a frequency selected from a range between the value of said resonant frequency $f_{max}$ in the non-discharging state defined by said expression for $f_{max}$ and a value corresponding to 80% of the $f_{max}$.

3. The plasma-generation power-supply device according to claim 2, wherein said discharging load is an ozonizer that has a gap interval of 0.6 mm or less and operates with a material gas containing oxygen at an atmospheric or higher gas pressure.

4. The plasma-generation power-supply device according to claim 1, wherein said discharging load is an ozonizer that has a gap interval of 0.6 mm or less and operates with a material gas containing oxygen at an atmospheric or higher gas pressure.

5. A plasma-generation power-supply device that drives a discharging load that generates a plasma, comprising:
- an alternating-current power-supply that supplies power to said discharging load; and
- resonance means that causes an alternating voltage outputted from said alternating-current power-supply to jump by resonance and applies the jump voltage as a load voltage to said discharging load,
- wherein said alternating-current power-supply is connected electrically directly to said resonance means,
- said alternating-current power-supply is formed of an inverter, and
- said resonance means comprises a reactor connected in series with said discharging load, and said load voltage is obtained by resonance of a capacitive component of said discharging load and said reactor, and wherein, when
- a ratio of said load voltage with respect to the output voltage of said inverter is defined as a voltage jump rate,
- Cg: an electrostatic capacity value of a dielectric included in said discharging load,
- Ca: an electrostatic capacity value of a gas region included in said discharging load, and
- Cp: a floating electrostatic capacity value in parallel with said discharging load,
- and a power-supply frequency of said alternating-current power-supply is set approximately equal to a resonant frequency of a circuit including said discharging load, and when a minimum value M00 of said voltage jump rate on a characteristic curve of said voltage jump rate with respect to said output voltage is defined by an expression below $$M00 = \sqrt{2}\left[\left(\left(1+\frac{Ca}{Cg}\right)\left(1+\frac{Cp}{Cg}\right)-\frac{1}{2}\right)+\sqrt{\left(\left(1+\frac{Ca}{Cg}\right)\left(1+\frac{Cp}{Cg}\right)-\frac{1}{2}\right)^2-\frac{1}{4}}\right]$$

$$\cong 2\sqrt{2}\left[\left(1+\frac{Ca}{Cg}\right)\left(1+\frac{Cp}{Cg}\right)-0.5\right]$$

then, said load voltage is set to be larger than $(\sqrt{2}/4)\cdot M00$ times said inverter's bus voltage and smaller than $\sqrt{2}\cdot(M00+2)$ times said inverter's bus voltage.

6. The plasma-generation power-supply device according to claim 5, wherein said discharging load is a cylindrical multi-tube type ozonizer that has a plurality of coaxially placed cylindrical electrodes, with a gap interval of 0.6 mm or less, and
- said load voltage is set to be larger than one times said inverter's bus voltage and smaller than six times said inverter's bus voltage.

7. A plasma-generation power-supply device that drives a discharging load that generates a plasma, comprising:
- an alternating-current power-supply that supplies power to said discharging load; and
- resonance means that causes an alternating voltage outputted from said alternating-current power-supply to jump by resonance and applies the jump voltage as a load voltage to said discharging load,
- wherein said alternating-current power-supply is connected electrically directly to said resonance means,
- said alternating-current power-supply is formed of an inverter, and
- said resonance means comprises a reactor connected in series with said discharging load, and said load voltage is obtained by resonance of a capacitive component of said discharging load and said reactor, and wherein when
- a ratio of said load voltage with respect to the output voltage of said inverter is defined as a voltage jump rate,
- Cg: an electrostatic capacity value of a dielectric included in said discharging load,
- Cp: a floating electrostatic capacity value in parallel with said discharging load,
- Vd: a bus voltage of said inverter, and
- V*: a discharge maintaining voltage,
- then, a power-supply frequency of said alternating-current power-supply is set approximately equal to a resonant frequency of a circuit including said discharging load, and the bus voltage Vd of said inverter is set in a range defined by an expression below, as compared with said discharge maintaining voltage V*, $$\frac{4V^*}{1+\frac{Cp}{Cg}} > V_d > \frac{V^*}{2\left(1+\frac{Cp}{Cg}\right)}.$$

8. The plasma-generation power-supply device according to claim 7, wherein said discharging load is a cylindrical multi-tube type ozonizer that has a plurality of coaxially placed cylindrical electrodes, with a gap interval of 0.6 mm or less, and
the bus voltage of said inverter is set to be larger than 0.5 times said discharge maintaining voltage and smaller than two times said discharge maintaining voltage.

* * * * *